(12) United States Patent
Lei et al.

(10) Patent No.: US 9,159,621 B1
(45) Date of Patent: Oct. 13, 2015

(54) DICING TAPE PROTECTION FOR WAFER DICING USING LASER SCRIBE PROCESS

(71) Applicants: Wei-Sheng Lei, San Jose, CA (US);
Brad Eaton, Menlo Park, CA (US);
Ajay Kumar, Cupertino, CA (US)

(72) Inventors: Wei-Sheng Lei, San Jose, CA (US);
Brad Eaton, Menlo Park, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/272,101

(22) Filed: May 7, 2014

Related U.S. Application Data

(60) Provisional application No. 61/985,754, filed on Apr. 29, 2014.

(51) Int. Cl.
*H01L 21/78* (2006.01)
*H01L 21/683* (2006.01)

(52) U.S. Cl.
CPC ............ *H01L 21/78* (2013.01); *H01L 21/6836* (2013.01)

(58) Field of Classification Search
None
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Charles Garber
*Assistant Examiner* — Alia Sabur
(74) *Attorney, Agent, or Firm* — Blakely Sokoloff Taylor Zafman LLP

(57) ABSTRACT

Methods of and apparatuses for dicing semiconductor wafers, each wafer having a plurality of integrated circuits, are described. In an example, a method of scribing a semiconductor wafer having a plurality of integrated circuits involves adhering a backside of a semiconductor wafer to an inner portion of a carrier tape of a substrate carrier that includes a tape frame mounted above the carrier tape. The method also involves overlaying a protective frame above a front side of the semiconductor wafer and above an exposed outer portion of the carrier tape, the protective frame having an opening exposing an inner region of the front side of the semiconductor wafer. The method also involves laser scribing the front side of the semiconductor wafer with the protective frame in place.

23 Claims, 19 Drawing Sheets

(56) References Cited

U.S. PATENT DOCUMENTS

| | | | |
|---|---|---|---|
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2009/0255911 | A1 | 10/2009 | Krishnaswami et al. |
| 2010/0013036 | A1 | 1/2010 | Carey |
| 2010/0216313 | A1 | 8/2010 | Iwai et al. |
| 2010/0248451 | A1 | 9/2010 | Pirogovsky et al. |
| 2011/0014777 | A1 | 1/2011 | Haji et al. |
| 2011/0312157 | A1 | 12/2011 | Lei et al. |
| 2012/0322237 | A1* | 12/2012 | Lei et al. .................. 438/462 |
| 2012/0322239 | A1* | 12/2012 | Singh et al. .................. 438/462 |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Ouye, Alan Hiroshi "Plasma Thermal Shield for Heat Dissipation in Plasma Chamber", U.S. Appl. No. 14/109,820, filed Dec. 17, 2013 67 pgs.

Lei, Wei-Sheng et al., "Wafer Edge Warp Suppression for Thin Wafer Supported by Tape Frame", U.S. Appl. No. 14/265,108, filed Apr. 29, 2014 65 pgs.

29, 2014 65 pgs.

\* cited by examiner

TOP VIEW

BOTTOM VIEW

DICING TAPE PROTECTION FOR WAFER DICING USING LASER SCRIBE PROCESS

CROSS-REFERENCE TO RELATED APPLICATIONS

This application claims the benefit of U.S. Provisional Application No. 61/985,754, filed on Apr. 29, 2014, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of scribing a semiconductor wafer having a plurality of integrated circuits involves adhering a backside of a semiconductor wafer to an inner portion of a carrier tape of a substrate carrier that includes a tape frame mounted above the carrier tape. The method also involves overlaying a protective frame above a front side of the semiconductor wafer and above an exposed outer portion of the carrier tape, the protective frame having an opening exposing an inner region of the front side of the semiconductor wafer. The method also involves laser scribing the front side of the semiconductor wafer with the protective frame in place.

In another embodiment, an apparatus includes a substrate carrier including a tape frame mounted above a carrier tape. The apparatus also includes a semiconductor wafer having a backside mounted to an inner portion of the carrier tape. A protective frame is disposed above a front side of the semiconductor wafer and above an exposed outer portion of the carrier tape. The protective frame has an opening exposing an inner region of the front side of the semiconductor wafer.

In another embodiment, a method of scribing a semiconductor wafer having a plurality of integrated circuits involves adhering a backside of a semiconductor wafer to an inner portion of a carrier tape of a substrate carrier that includes a tape frame mounted above the carrier tape. The method also involves adhering a protective mask to a front side of the semiconductor wafer and to an exposed outer portion of the carrier tape, the protective mask having an opening exposing an inner region of the front side of the semiconductor wafer. The method also involves laser scribing the front side of the semiconductor wafer with the protective mask in place.

DETAILED DESCRIPTION

Figure 1A:
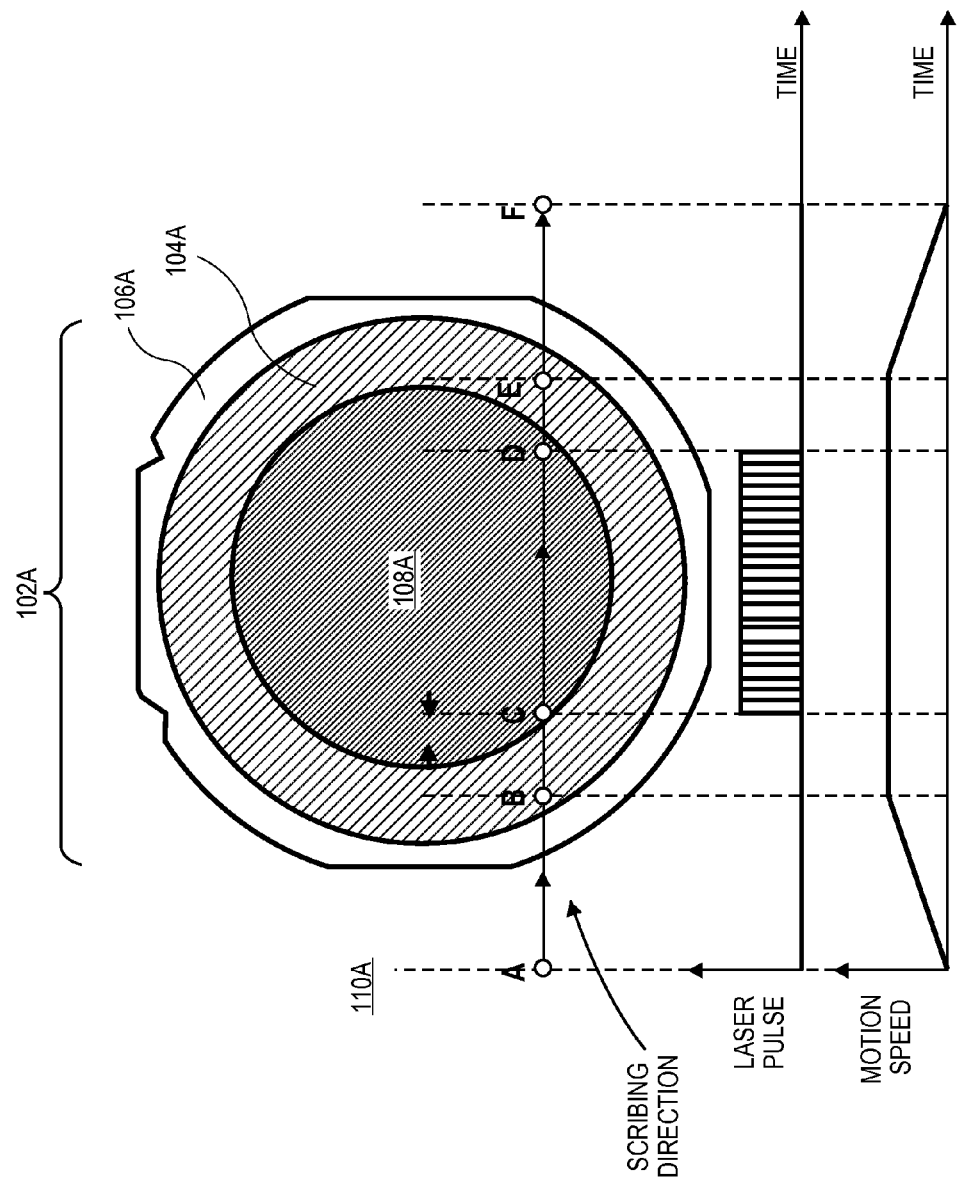
FIG. 1A illustrates a plan view of a wafer mounted on a tape frame with a corresponding timing chart showing perfect synchronization between motion control and laser pulse control, in accordance with an embodiment of the present invention.

Methods of and apparatuses for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. One or more embodiments described herein are directed to dicing tape protection during a laser scribing process used for wafer dicing.

To provide context, subsequent to a conventional wafer dicing process, a diced wafer as supported by a tape frame based substrate carrier is subjected to (a) wafer (wet) cleaning to remove a dicing mask and (b) tape expansion and die pick. For both the wafer cleaning and tape expansion/die pick operations, the diced wafer is typically placed on a vacuum chuck. Accordingly, the underlying dicing tape supported by the tape frame (e.g., including both dicing tape portions underneath the diced wafer and dicing tape portions exposed between the frame and wafer) must be free of through-holes or through-cuts. Otherwise, the diced wafer cannot be chucked.

Conventional laser scribing of a wafer on a tape frame requires that a laser scribing process begins the laser scribing directly on the wafer, with the starting point situated very close to the wafer edge (e.g., within approximately 3 millimeters from the wafer edge), in order to ensure that all dies are fully diced or singulated. Accordingly, precise laser control is required of the laser pulse on and off mode during each pass of the scribing process. Imperfect synchronization between the scribing motion control and the laser pulse on/off control can lead to initiation of the laser pulse on an exposed portion of the dicing tape which can lead to (a) dicing tape damage (e.g., drill or cut through the dicing tape) and/or (b) incomplete laser scribing of the wafer by the end of the scribing process.

To demonstrate the concepts at hand, FIG. 1A illustrates a plan view of a wafer mounted on a tape frame with a corresponding timing chart showing perfect synchronization between motion control and laser pulse control, in accordance with an embodiment of the present invention.

Referring to FIG. 1A, a substrate carrier 102A includes a dicing tape 104A and an overlying tape frame 106A. A wafer 108A for dicing is supported on the dicing tape 104A either directly or with an adhesive layer. The tape frame 106A surrounds the wafer 108A and holds the dicing tape 106A in a mostly fixed position. A timing plot 110A demonstrates perfect synchronization between motion control (motion speed) and laser pulse control (laser pulse) as a function of time to ensure that a laser pulse start is initiated on the wafer 108A and not on the exposed portion of the dicing tape 106A. Along the illustrated scribing direction, perfect synchronization involves start motion at location A, achieving set motion speed at location B, start laser pulse (start laser scribing) on the wafer 108A at location C, stop laser pulse (end laser scribing) at location D, slow down of motion at location E, and end of motion at location F.

Figure 1B:
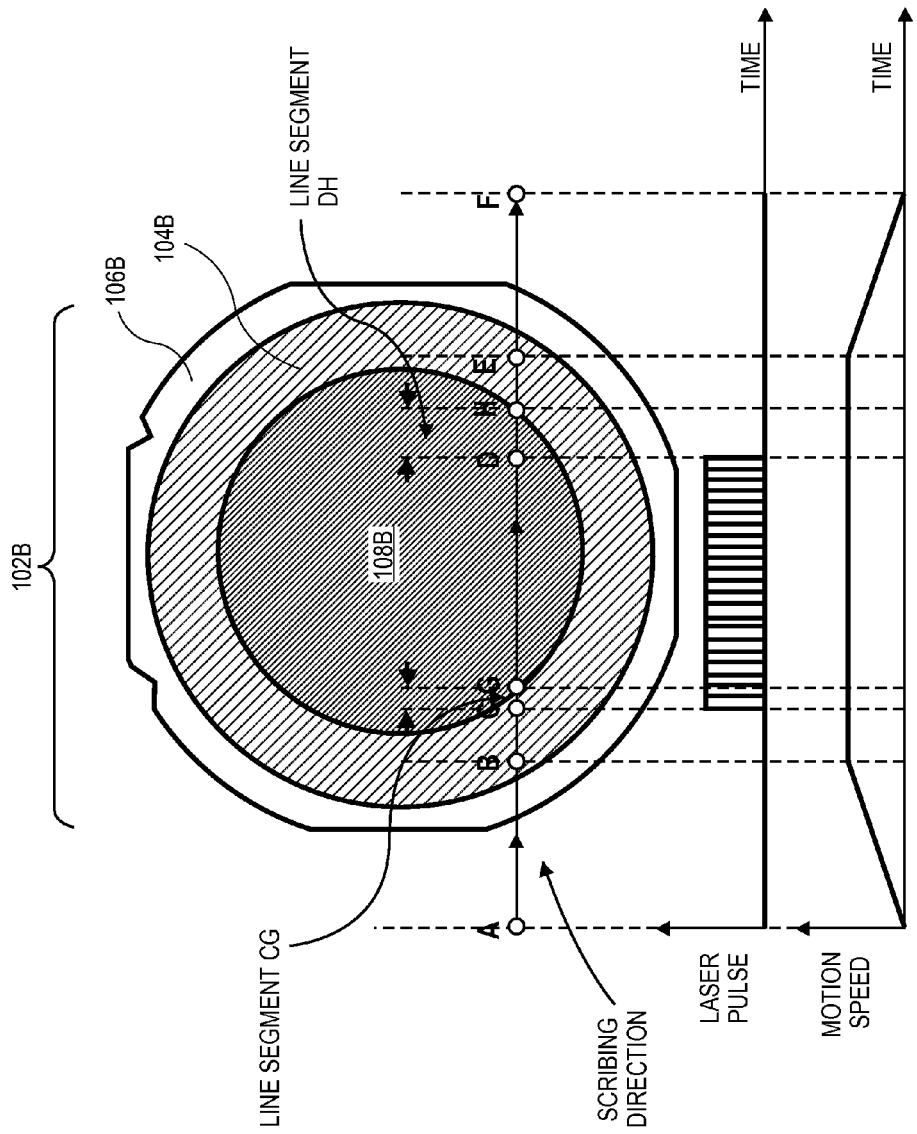
FIG. 1B illustrates a plan view of a wafer mounted on a tape frame with a corresponding timing chart showing imperfect synchronization between motion control and laser pulse control, in accordance with an embodiment of the present invention.

By contrast to FIG. 1A, FIG. 1B illustrates a plan view of a wafer mounted on a tape frame with a corresponding timing chart showing imperfect synchronization between motion control and laser pulse control, in accordance with an embodiment of the present invention.

Referring to FIG. 1B, a substrate carrier 102B includes a dicing tape 104B and an overlying tape frame 106B. A wafer 108B for dicing is supported on the dicing tape 104B either directly or with an adhesive layer. The tape frame 106B surrounds the wafer 108B and holds the dicing tape 106B in a mostly fixed position. A timing plot 110B demonstrates imperfect synchronization between motion control (motion speed) and laser pulse control (laser pulse) as a function of time. Along the illustrated scribing direction, imperfect synchronization might involve start motion at location A, achieving set motion speed at location B, and start laser pulse (start laser scribing) at location C. However, as depicted, since the timing if off, location C is on the dicing tape 104B instead of on the wafer 108B at location G. As a result, laser drilling or cutting of the dicing tape 106B along the line segment CG can occur.

Referring again to FIG. 1B, continuing along the illustrated scribing direction, due to imperfect timing the stop laser pulse (end laser scribing) is at location D inward from the wafer edge instead of at the wafer edge at location H. The remainder of the timing involves slow down of motion at location E, and end of motion at location F. In this scenario, as depicted, when the laser pulse off mode is initiated too early, incomplete scribing may occur along line segment DH.

Addressing one or more of the above described issues, one or more embodiments disclosed herein involve implementing a top frame or top mask for dicing tape protection as added on top of a wafer-on-tape frame assembly prior to laser scribing. In one embodiment, the top frame or top mask is fabricated from metals or plastics. In either case, in a particular embodiment, the thickness of the top frame or top mask is at least approximately 0.3 millimeters in order to maintain sufficient rigidity and to withstand laser radiation without being cut through. In one embodiment, the top frame or top mask has an inner (opening) diameter slightly less than an underlying wafer diameter. For example, in a specific embodiment, the inner diameter is approximately in the range of 295-299 millimeters for a for an underlying 300 millimeter-in-diameter wafer.

In an embodiment, use of an opening having a slightly smaller than wafer diameter top frame or top mask ensures that, with reasonable alignment, the protection frame or mask covers the exposed tape portion between the film frame and the wafer. Additionally, opening is not too small such that the top frame or mask only covers a very small portion of the wafer edge, e.g., approximately in the range of 0.5 to 2.5 millimeters of the wafer edge such that all complete dies can be singulated. With the protection frame or mask in place, tight synchronization between motion control and laser pulse on/off control may be relaxed. In one embodiment, the laser scribing system can maintain a laser pulse in an on mode over a longer period to ensure complete wafer scribing, while still avoiding tape damage.

Figure 2:
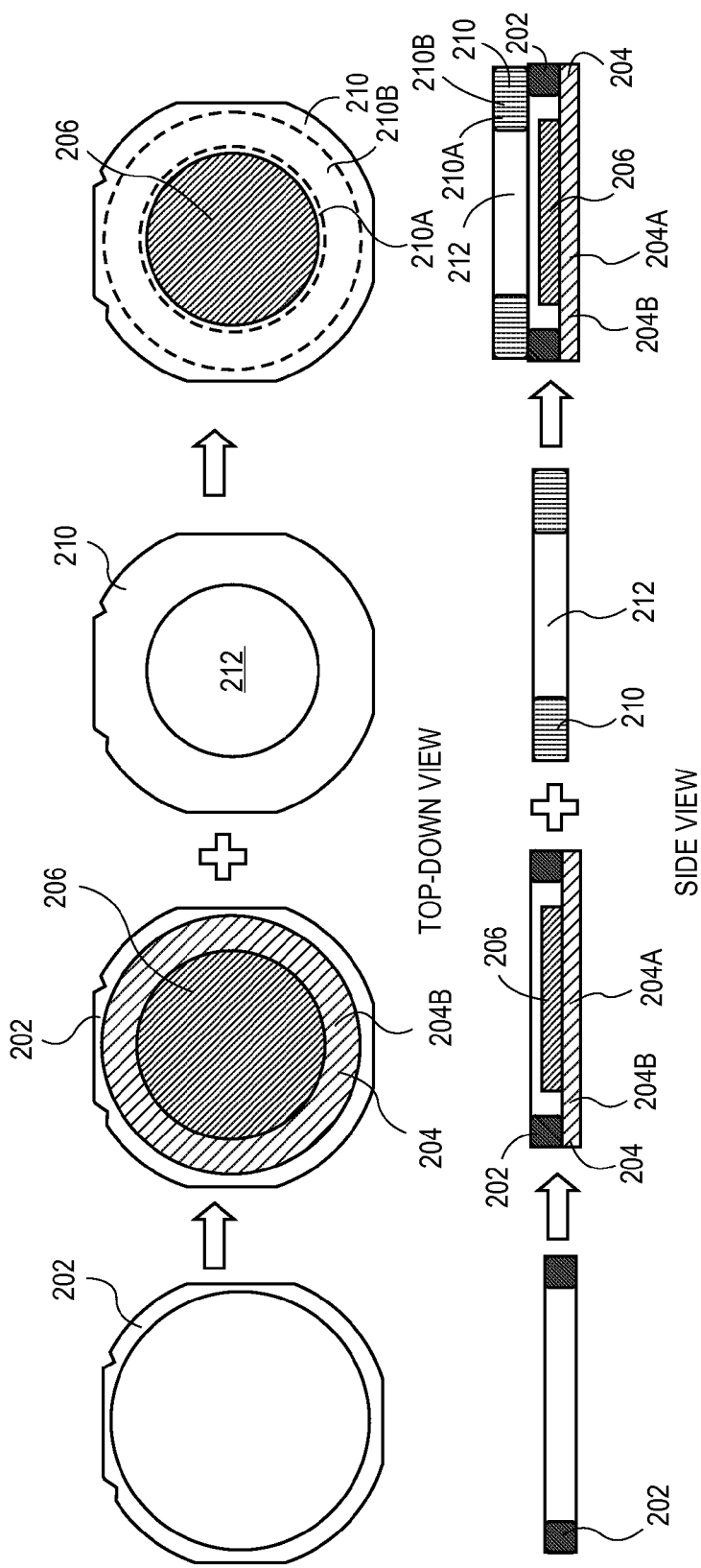
FIG. 2 illustrates plan and corresponding cross-sectional views representing various operations in a method of mounting a wafer on a substrate carrier followed by mounting a top frame for dicing tape protection during a laser scribing process, in accordance with an embodiment of the present invention.

In a first example, FIG. 2 illustrates plan and corresponding cross-sectional views representing various operations in a method of mounting a wafer on a substrate carrier followed by mounting a top frame for dicing tape protection during a laser scribing process, in accordance with an embodiment of the present invention.

Referring to FIG. 2, a backside of a semiconductor wafer 206 is adhered to an inner portion 204A of a carrier or dicing tape 204 of a substrate carrier that includes a tape frame 202 mounted above the carrier tape 204. The semiconductor wafer 206 can be mounted directly or via an adhesive layer such as a die attach film. A top frame 210 is situated above a front side of the semiconductor wafer 206 (portion 210A of top frame 410) and above at least a portion of the substrate carrier (portion 210B of top frame 410). The top frame 210 includes an opening 212 that, upon alignment of tope frame 210 with the semiconductor wafer 206, exposes an inner region of the front side of the semiconductor wafer 206. The top frame 210 (particularly portion 210B) covers the exposed region 204B of the carrier tape 204.

In an embodiment, upon overlaying or placement of the top frame 210, the inner region of the front side of the semiconductor wafer 206 exposed by the opening 212 is subjected to a wafer scribing operation. In one such embodiment, processing the inner region of the front side of the semiconductor wafer 206 involves laser scribing the semiconductor wafer 206 from the front side of the semiconductor wafer 206. In one such embodiment, a dicing mask is applied to the front side of the semiconductor wafer 206 prior to the laser scribing process. In one embodiment, such dicing mask is applied prior to placement of the top frame 210 above the semiconductor wafer 210 and substrate carrier. In the laser scribing process, the dicing mask and at least a portion of the semiconductor wafer is scribed. In one embodiment, the top frame 210 (particularly portion 210B) protects the exposed region 204B of the carrier tape 204 from laser pulse misfires such as described in association with FIG. 1B.

Referring again to FIG. 2, in an embodiment, the top frame 210 has a same or similar outer edge profile as the corresponding tape frame 202 to facilitate alignment to the wafer-on-tape frame assembly. However, in one such embodiment, the inner diameter of the top frame 210 is much smaller than the inner diameter of the film frame 202. In one such embodiment, the inner diameter of the top frame 210 is slightly less than the corresponding wafer diameter.

Figure 3:
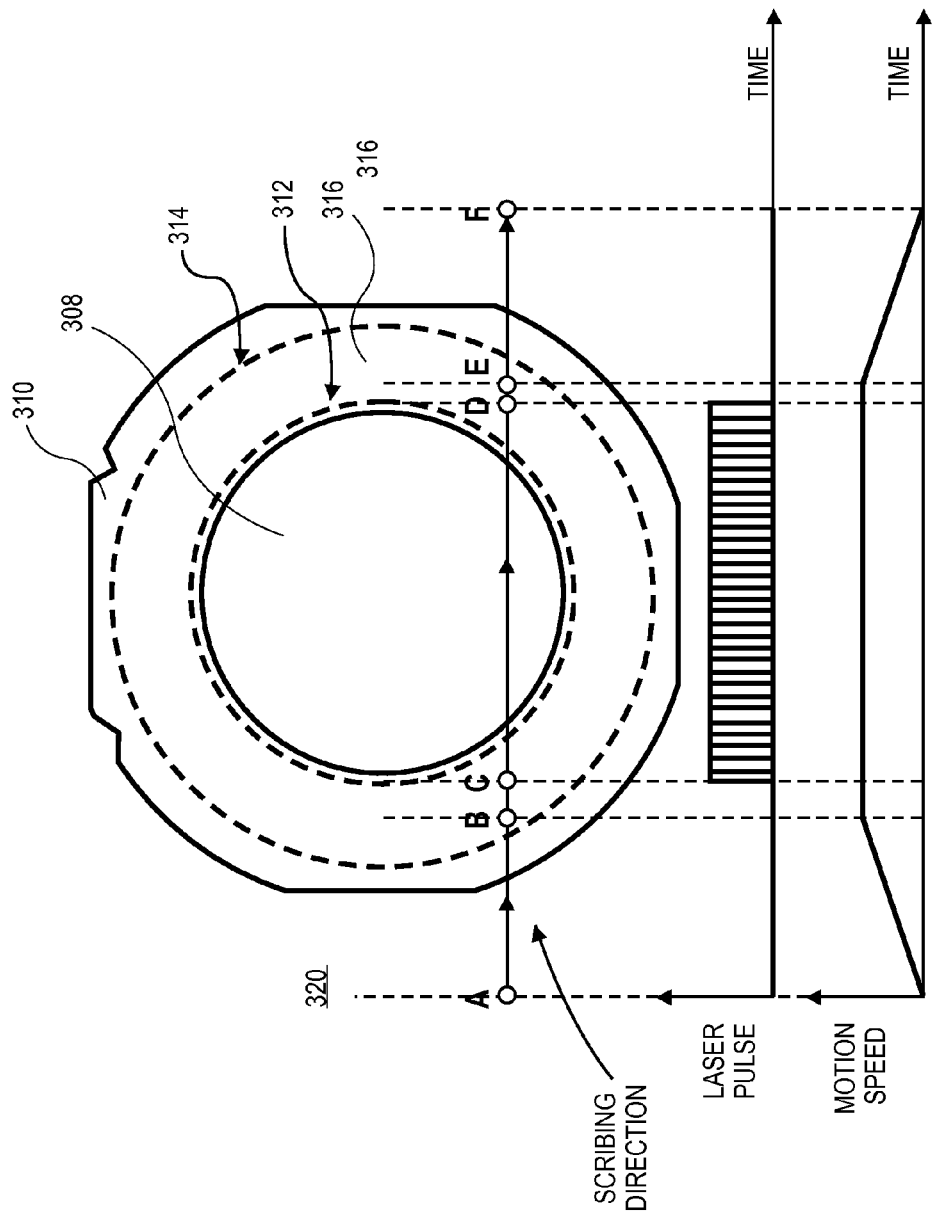
FIG. 3 illustrates a plan view of a top frame wafer positioned above a tape frame with a corresponding timing chart showing that perfect synchronization between motion control and laser pulse control need not be achieved for successful dicing, in accordance with an embodiment of the present invention.

FIG. 3 illustrates a plan view of a top frame wafer positioned above a tape frame with a corresponding timing chart showing that perfect synchronization between motion control and laser pulse control need not be achieved for successful dicing, in accordance with an embodiment of the present invention.

Referring to FIG. 3, a substrate carrier (not shown) includes a dicing tape and an overlying tape frame. A wafer 308 for dicing is supported on the dicing tape either directly or with an adhesive layer. A top frame 310 is positioned above the substrate 108 and the underlying substrate carrier. As demonstrated by dashed lines, in one embodiment, the top frame covers the wafer edge 312 and at least the inner edge 314 of the tape frame. The region of exposed dicing tape 316 in between the wafer edge 312 and the inner edge 314 of the tape frame is protected from above by the top frame 310.

Referring again to FIG. 3, a timing plot 320 demonstrates that perfect synchronization need not be achieved between motion control (motion speed) and laser pulse control (laser pulse) as a function of time without harm to exposed portions 316 of the dicing tape. For example, along the illustrated scribing direction, synchronization with relaxed timing requirements involves start motion at location A, achieving set motion speed at location B, start laser pulse (start laser scribing) at location C which need not necessarily be on the wafer 308, stop laser pulse (end laser scribing) at location D which need not necessarily be on the wafer 308, slow down of motion at location E, and end of motion at location F. This, the laser pulse mode be ON prior to the laser reaching the wafer for laser scribe initiation, and may be maintained ON after the laser leaves the wafer for the end of a single scribe pass.

The above embodiments focus on a top protection frame. Other embodiments may include use of a top protection mask, such as a top-applied patterned dicing tape. Thus, in a second example, in one embodiment, a patterned dicing tape is applied as a top mask onto a wafer front side and, possibly, on at least a portion of the corresponding mounting tape and frame. The patterned dicing tape may have a central hole with a diameter slightly smaller than the wafer diameter. In one embodiment, an outer edge of the patterned tape is mounted onto the front surface of the supporting dicing tape and frame. For laser scribing, in a particular embodiment, the patterned front side dicing tape (top mask) can act as a sacrificial layer for scenarios where one or more laser pulses are misfired onto the dicing tape area.

Figure 4A:
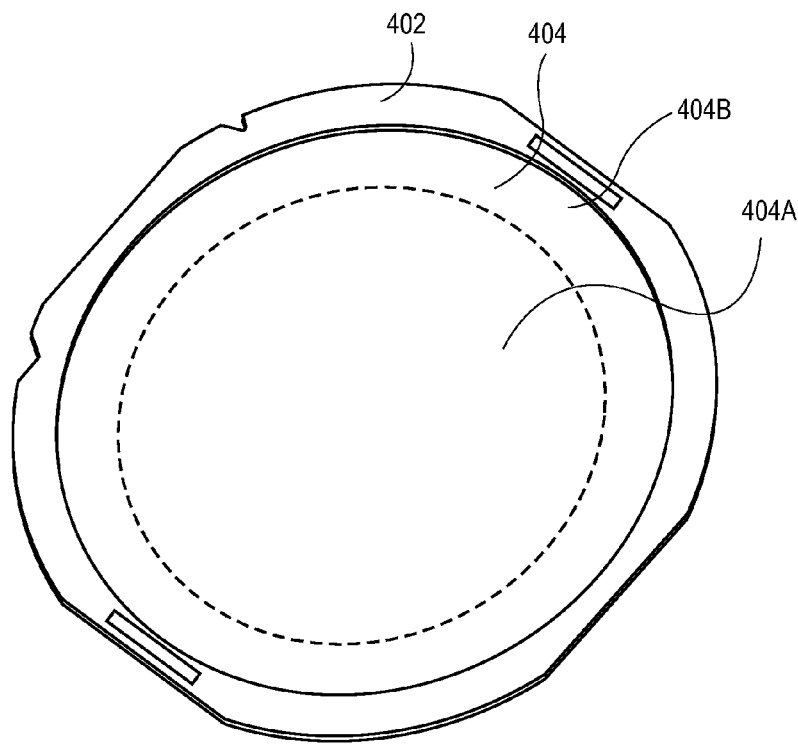
FIGS. 4A-4C illustrate top down views representing various operations in a method of mounting a wafer on a substrate carrier, in accordance with an embodiment of the present invention.
Figure 4B:
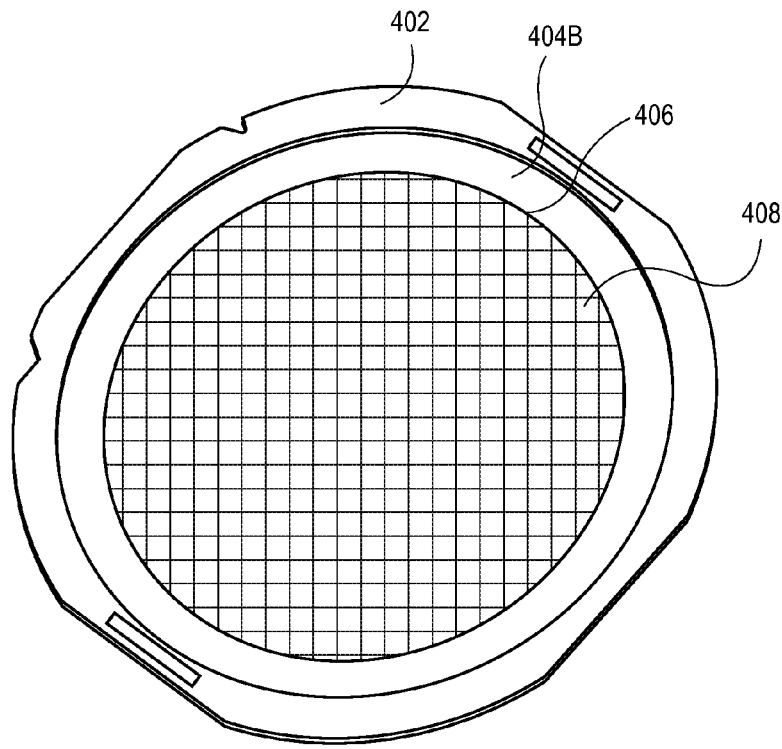
Figure 4C:
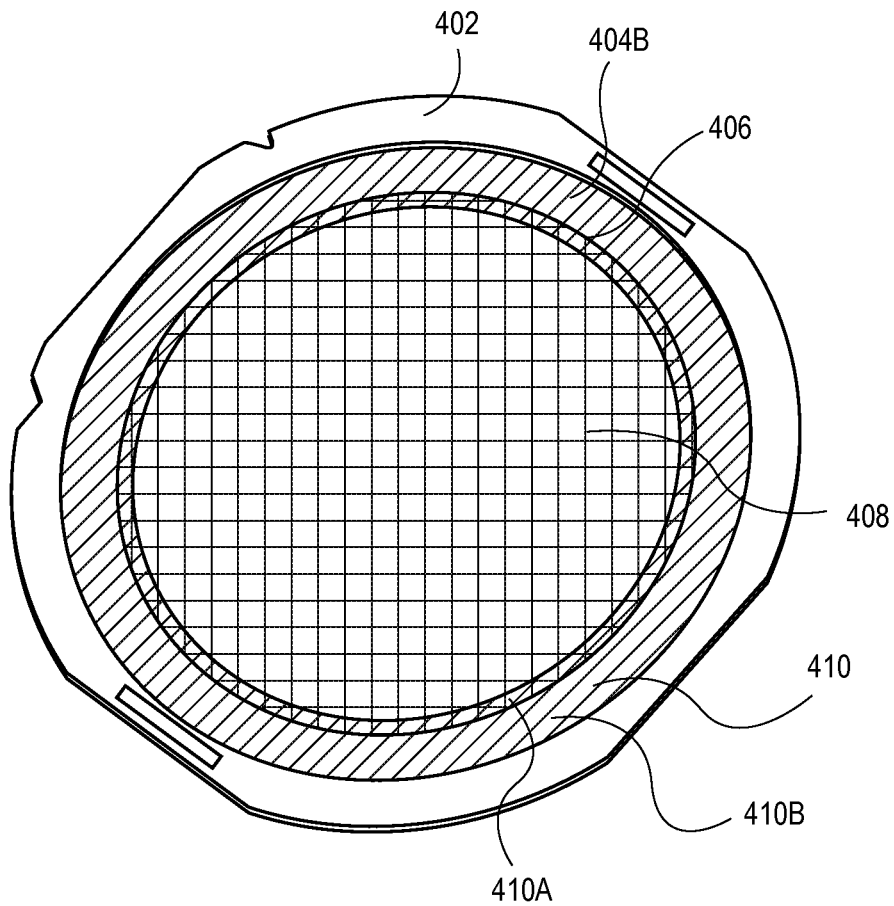

As a general example of a top mask, FIGS. 4A-4C illustrate top down views representing various operations in a method of mounting a wafer on a substrate carrier, in accordance with an embodiment of the present invention.

Referring to FIG. 4A, a substrate carrier includes a tape frame 402 mounted above a carrier tape 404. The carrier tape 404 includes an inner region 404A and an outer region 404B. Referring to FIG. 4B, a semiconductor wafer 406 is mounted on the inner region 404A of the carrier tape 404, leaving outer region 404B of the carrier tape 404 exposed. In one embodiment, the semiconductor wafer 406 is mounted on the inner region 404A of the carrier tape 404 by the backside of the semiconductor wafer 406 to leave the front side 408 exposed, e.g., with a plurality of integrated circuits exposed, as is depicted in FIG. 4B.

Referring to FIG. 4C, an adhesive tape 410 is adhered to a portion of the front side 408 of the semiconductor wafer 406 and to at least a portion of the substrate carrier. For example, as depicted, the adhesive tape 410 has a region 410A adhered to an outer region of the front side 408 of the semiconductor wafer 406. Another region 410B of the adhesive tape 410 is adhered to the exposed outer region 404B of the carrier tape 404. Although not depicted, in an embodiment, the adhesive tape 410 is larger and is further adhered to at least a portion of, and possibly the entire top surface of, the tape frame 402.

Referring again to FIG. 4C, the adhesive tape 410 has an opening exposing an inner region of the front side 408 of the semiconductor wafer 406. In one such embodiment, the opening exposes an inner region which includes at least approximately 98% of the diameter of the front side 408 of the semiconductor wafer. In one embodiment, a total diameter of the semiconductor wafer 406 is 300 millimeters and the opening leaves exposed a region having a diameter approximately in the range of 295-299 millimeters.

Figure 5:
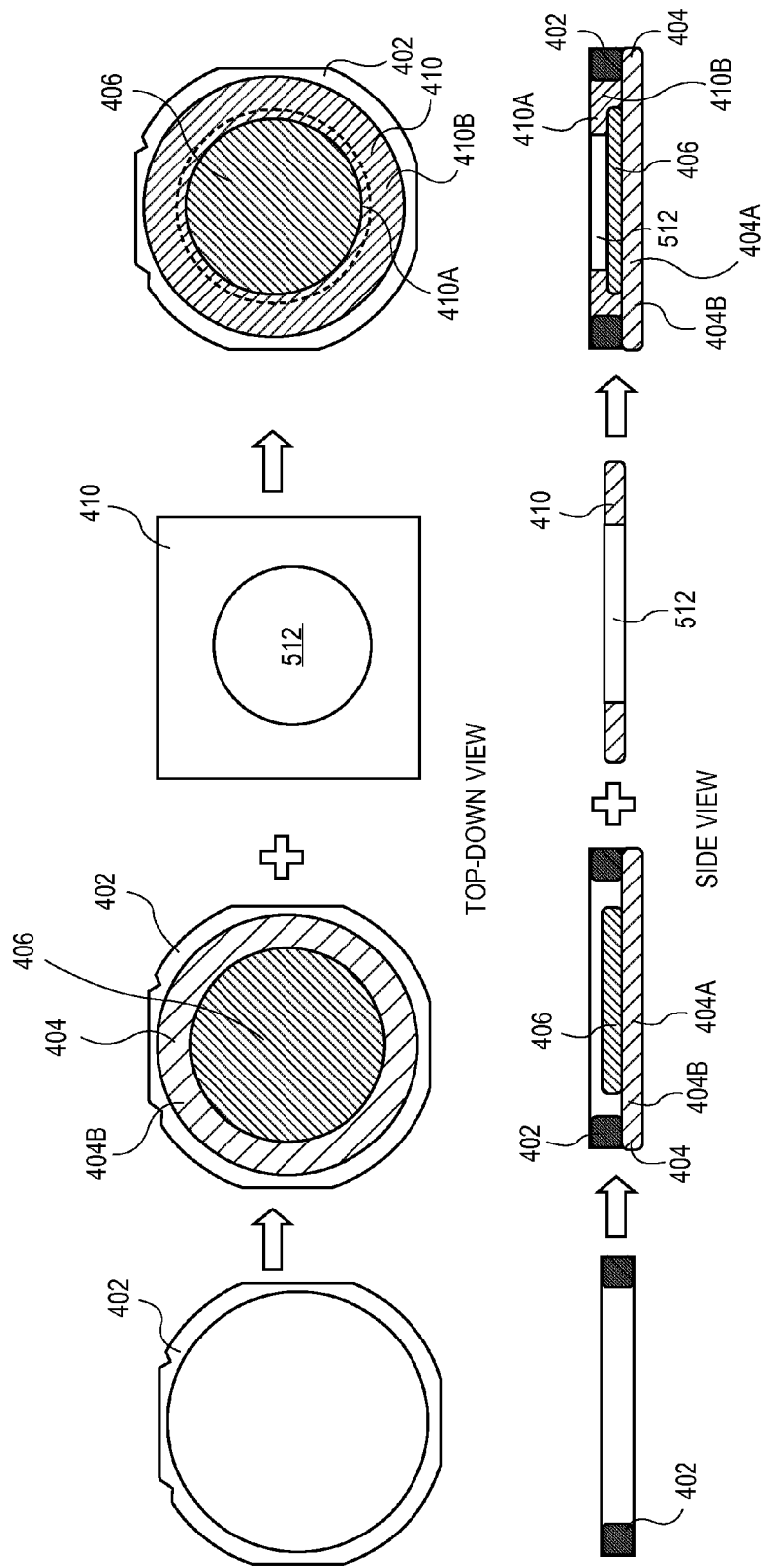
FIG. 5 illustrates plan and corresponding cross-sectional views representing various operations in a method of mounting a wafer on a substrate carrier using front side adhesive or dicing tape as a top mask for a laser scribing process, in accordance with an embodiment of the present invention.

FIG. 5 illustrates plan and corresponding cross-sectional views representing various operations in a method of mounting a wafer on a substrate carrier using front side adhesive or dicing tape as a top mask for a laser scribing process, in accordance with an embodiment of the present invention.

Referring to FIG. 5, a backside of a semiconductor wafer 406 is adhered to an inner portion 404A of a carrier or dicing tape 404 of a substrate carrier that includes a tape frame 402 mounted above the carrier tape 404. The semiconductor wafer 406 can be mounted directly or via an adhesive layer such as a die attach film. An adhesive tape 410 is adhered to a front side of the semiconductor wafer 406 (portion 410A of adhesive tape 410) and to at least a portion of the substrate carrier (portion 410B of adhesive tape 410). The adhesive tape 410 includes an opening 512 that, once applied, exposes an inner region of the front side of the semiconductor wafer 406. The adhesive tape 410 (particularly portion 410B) covers the exposed region 404B of the carrier tape 404.

In an embodiment, upon application of the adhesive tape 410, the inner region of the front side of the semiconductor wafer 406 exposed by the opening 512 is subjected to a wafer scribing operation. In one such embodiment, processing the inner region of the front side of the semiconductor wafer 406 involves laser scribing the semiconductor wafer 406 from the front side of the semiconductor wafer 406. In one such embodiment, a dicing mask is applied to the front side of the semiconductor wafer 406 prior to the laser scribing process. The dicing mask may be applied prior to or subsequent to adhering the adhesive tape 410 to the semiconductor wafer 410 and substrate carrier. In the laser scribing process, the dicing mask and at least a portion of the semiconductor wafer is scribed. The adhesive tape 410 (particularly portion 410B) protects the exposed region 404B of the carrier tape 404 from laser pulse misfires such as described in association with FIG. 1B.

Thus, referring to FIGS. 2, 3, 4A-4C and 5, a top dicing tape protection mask or frame having an inner diameter slightly less than a corresponding wafer diameter is positioned above and overlaying a wafer-on-tape frame assembly prior to laser scribing. The otherwise tight synchronization between motion control and laser pulse on/off control may be relaxed upon use of such a top dicing tape protection mask or frame. In one embodiment, the laser scribing system can maintain a laser pulse in an on mode over a longer period to ensure complete wafer scribing while avoiding tape damage. In an embodiment, whether a protection mask or a protection frame is used, dicing is complete following the laser scribing process in that die singulation is complete. In another embodiment, whether a protection mask or a protection frame is used, dicing is completed by a subsequent plasma etch process used to complete die singulation. In the latter case, in a particular embodiment where a protection frame is used, the protection frame is removed prior to plasma etching. In another particular embodiment, where a protection mask is used, the protection mask can be removed prior to plasma etching or may be retained through the plasma etching operation.

Thus, in another aspect, with a front side protection mask in place, one or more embodiments described herein are directed to a shadow or cover ring for heat dissipation in a plasma etch chamber used to etch a substrate adhered to a substrate carrier with a front side protection mask still in place. Embodiments may include plasmas and plasma based processes, thermal management, active cooling, and heat dissipation. One or more embodiments described herein are directed to an actively-cooled shadow ring or to a plasma thermal shield for heat dissipation in a plasma chamber.

In accordance with an embodiment of the present invention, described herein are one or more apparatuses for, and methods of, protecting a substrate carrier composed of thin wafer tape and a tape frame during plasma etch in a singulation process. For example, an apparatus may be used to support and protect the film and film frame used to hold a thin silicon wafer from etch gases. The manufacturing processes related to integrated circuit (IC) packaging may require that a thinned silicon wafer be supported and mounted on a carrier film.

As described above, a substrate for dicing is supported by a substrate carrier during the plasma etching portion of a die singulation process, e.g., of a hybrid laser ablation and plasma etching singulation scheme. For example, FIG. 4A illustrates a plan view of a substrate carrier suitable for supporting a wafer during a singulation process, in accordance with an embodiment of the present invention.

Figure 6A:
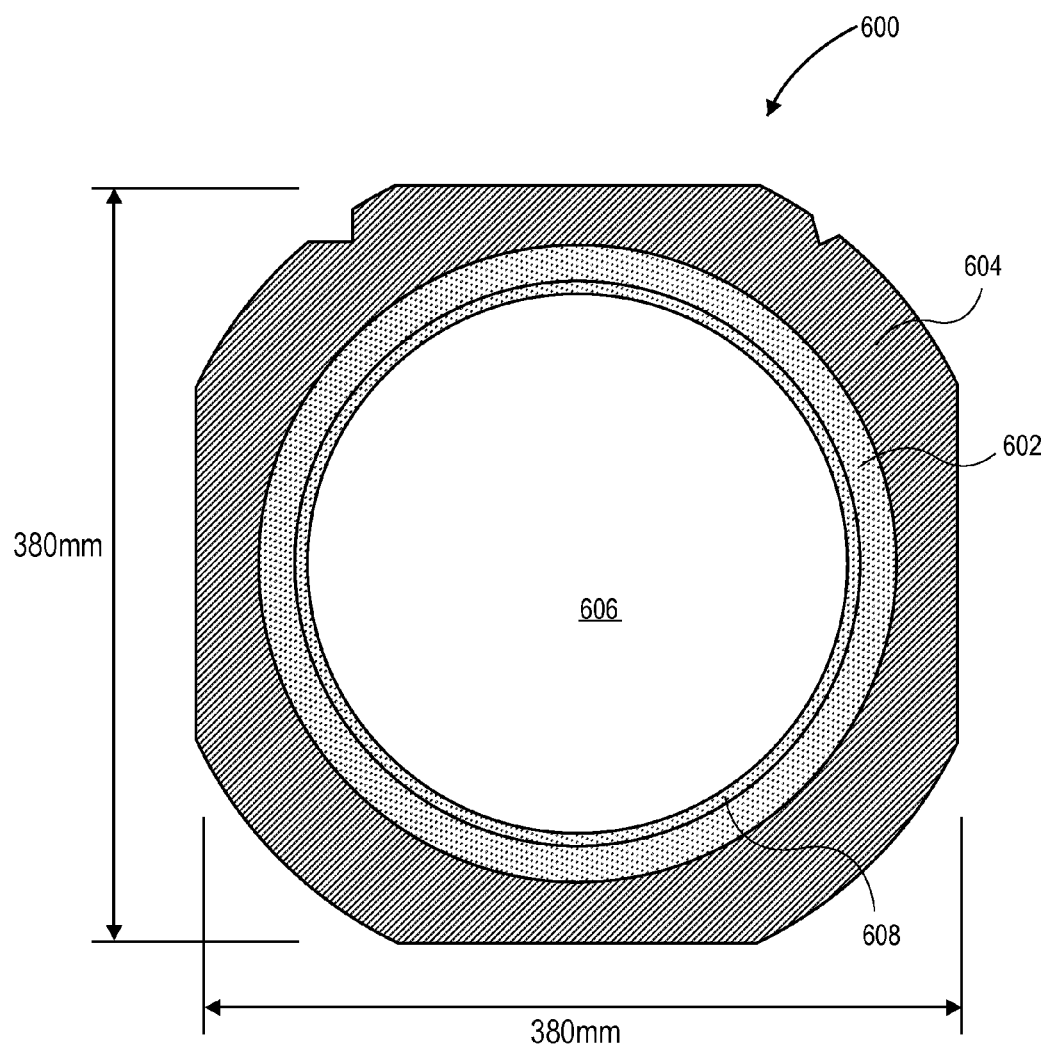
FIG. 6A illustrates a plan view of a substrate carrier suitable for supporting a wafer during a singulation process, in accordance with an embodiment of the present invention.

Referring to FIG. 6A, a substrate carrier 600 includes a region of a layer of backing tape 602 surrounded by a tape ring or frame 604. A wafer or substrate 606 is supported by the backing tape 602 of the substrate carrier 600. In one embodiment, the wafer or substrate 606 is attached to the backing tape 602 by a die attach film. In one embodiment, the tape ring 604 is composed of stainless steel. Referring again to FIG. 6A, in an embodiment, an overlying protection mask 608 (such as an adhesive type that may be similar to a dicing tape) is adhered to a front side of the semiconductor wafer 606 and to at least a portion of the substrate carrier 600. The adhesive tape 608 has an opening exposing an inner region (non-shaded portion) of the front side of the semiconductor wafer 606.

In an embodiment, a singulation process can be accommodated in a system sized to receive a substrate carrier such as the substrate carrier 600. In one such embodiment, a system such as system 1500, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 6A. However, it is to be appreciated that systems may be designed to handle 450 millimeter wafers or substrate or, more particularly, carriers for 450 millimeter wafers or substrates.

In an embodiment, a substrate carrier is accommodated in an etch chamber during a singulation process. In an embodiment, the assembly including a wafer or substrate on the substrate carrier is subjected to a plasma etch reactor without affecting (e.g., etching) the film frame (e.g., tape ring 604) and the film (e.g., backing tape 602). In one such embodiment, a shadow ring (such as an actively-cooled shadow ring) or a plasma thermal shield, or both, are implemented during the etch portion of the dicing process. In an example, FIG. 6B illustrates the substrate carrier of FIG. 6A with an overlying shadow ring or a plasma thermal shield, or both, in accordance with an embodiment of the present invention.

Figure 6B:
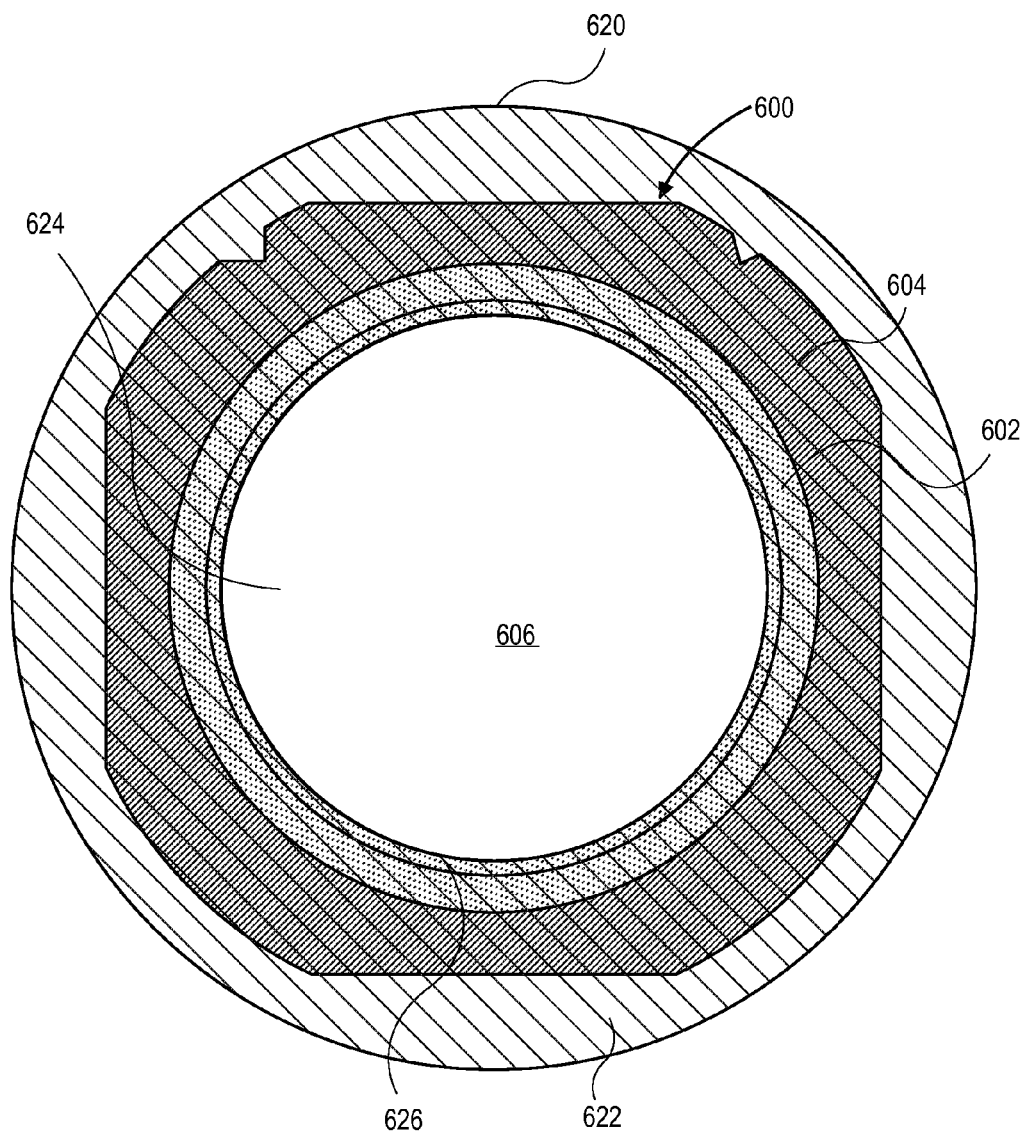
FIG. 6B illustrates the substrate carrier of FIG. 6A with an overlying shadow ring or plasma thermal shield, or both, in accordance with an embodiment of the present invention.

Referring to FIG. 6B, the substrate carrier 600, including the layer of backing tape 602 and tape ring or frame 604 is covered, in a top view perspective, by a shadow ring (such as an actively-cooled shadow ring) or a plasma thermal shield, or both, (all options represented as 620 in FIG. 6B). The shadow ring or plasma thermal shield, or both, 620 includes a ring portion 622 and inner opening 624. In one embodiment, a portion of the supported wafer or substrate 606 is also covered by the shadow ring or plasma thermal shield, or both, 620 (specifically, portion 626 of the shadow ring or plasma thermal shield, or both, 620 covers a portion of the wafer or substrate 606). In a specific such embodiment, the portion 626 of the shadow ring or plasma thermal shield, or both, 620 covers approximately 1-1.5 mm of the outer most portion of the wafer or substrate 606. The portion covered may be referred to as the exclusion region of the wafer or substrate 606 since this area is effectively shielded from a plasma process. Referring again to FIG. 6B, in an embodiment, the portion 626 of the shadow ring or plasma thermal shield, or both, 620 covers at least a portion of the overlying protection mask 608 adhered to the front side of the semiconductor wafer 606. In one such embodiment, the portion 626 of the shadow ring or plasma thermal shield, or both, 620 covers all of the portion of the overlying protection mask 608 adhered to the front side of the semiconductor wafer 606 as well as the portions of the overlying protection mask 608 adhered to the substrate carrier.

In a first such aspect, an actively-cooled shadow ring for heat dissipation in a plasma chamber is now described in greater detail. In an embodiment, an actively-cooled shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of an actively-cooled shadow ring can provide other process benefits can include an increase in throughput. For example, temperature reduction may otherwise be achieved by easing of process conditions such as RF power reduction, but this requires an increase in process time which is detrimental to throughput.

Figure 7:
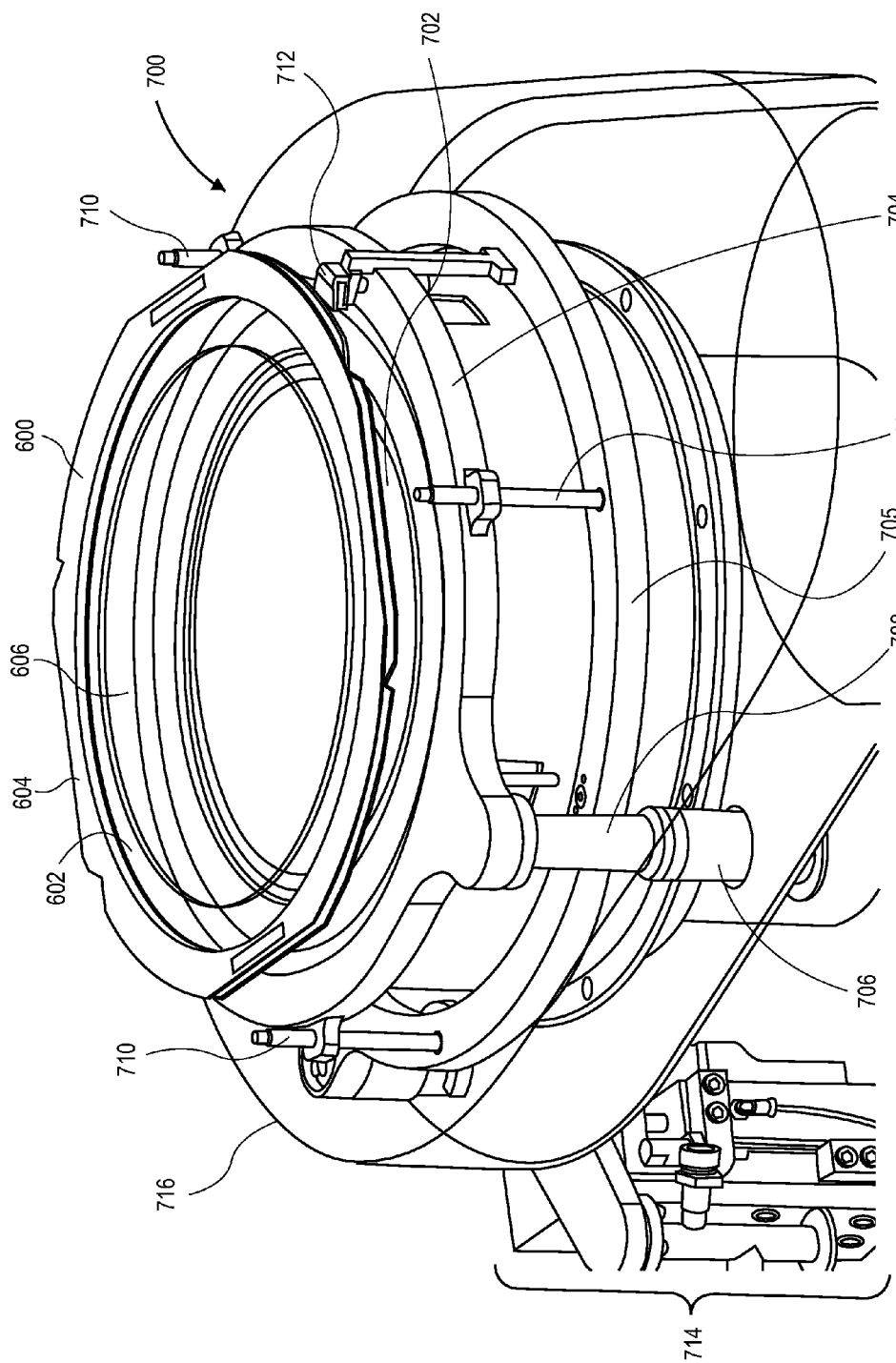
FIG. 7 illustrates an angled view of an actively-cooled shadow ring for heat dissipation in a plasma chamber with relative positioning to an etch cathode shown and relative sizing to a wafer support shown, in accordance with an embodiment of the present invention.

FIG. 7 illustrates an angled view of an actively-cooled shadow ring for heat dissipation in a plasma chamber with relative positioning to an etch cathode shown and relative sizing to a wafer support shown, in accordance with an embodiment of the present invention.

Referring to FIG. 7, a support apparatus 700 for a plasma chamber includes a cathode 702 positioned below an actively-cooled shadow ring 704. A wafer or substrate support 600 with a tape 602 and frame 604 and supporting a wafer of substrate 606 is shown above the actively-cooled shadow ring 704 for sizing perspective. Such a wafer or substrate support can be as described above with respect to FIG. 6A. In use, the wafer or substrate support 600 is actually position between the actively-cooled shadow ring 704 and the cathode 702. The support apparatus 700 may also include a motorized assembly 714 and a casing 716, which is also depicted in FIG. 7. In an embodiment, although not shown in FIG. 7, an overlying protection mask is adhered to a front side of the semiconductor wafer 606 and to at least a portion of the substrate carrier 600. The protection mask has an opening exposing an inner region of the front side of the semiconductor wafer 606.

Referring again to FIG. 7, the actively-cooled shadow ring 704 is fed with coolant gas or liquid by a bellows feed-through 706 which feeds into a plasma exposed coupler 708. In an embodiment, the actively-cooled shadow ring 704 is raised or lowered relative to a fixed cathode by three vertical posts 710 which can be raised for introduction of the substrate or wafer carrier 600 to the cathode 702 and then lowered to clamp the substrate or wafer carrier 600 into position. The three vertical posts 710 attach the actively-cooled shadow ring 704 to a circular ring 705 below. The circular ring 705 is connected to the motorized assembly 714 and provides the vertical motion and positioning of the actively-cooled shadow ring 704.

The substrate or wafer carrier 600 may rest on a plurality of pads that sit between the actively-cooled shadow ring 704 and the cathode 702. For illustrative purposes, one such pad 712 is depicted. However, it is to be appreciated that the pad 712 is actually below or underneath the actively-cooled shadow ring 704, and that more than one pad is typically used, such as four pads. In an embodiment, the actively-cooled shadow ring 704 is composed of aluminum with a hard anodized surface or a ceramic coating. In an embodiment, the actively-cooled shadow ring 704 is sized to entirely cover, from a top-down perspective, the tape frame 604, the tape 602, and the outer most region of the substrate 606 during plasma processing, as was described in association with FIG. 6B. In one specific such embodiment, the leading edge of the shadow ring to the wafer is approximately 0.050 inches high.

In an embodiment, the cathode 702 is an etch cathode and can function as an electrostatic chuck to assist in sample clamping during processing. In one embodiment, the cathode 702 is thermally controlled.

In an embodiment, the actively-cooled shadow ring 704 is capable of dissipating a large quantity of plasma heat and in a short period of time. In one such embodiment, the actively-cooled shadow ring 704 is designed to be capable of reducing a shadow ring from temperatures greater than 260 degrees Celsius to less than 120 degrees Celsius on a continuous processing basis. In an embodiment, with a vacuum-to-atmosphere connection available, an internal plasma-exposed component could be cooled and/or vertically-moved in a chamber.

In a second such aspect, a plasma thermal shield for heat dissipation in a plasma chamber is now described in greater detail. The plasma thermal shield can be used with a standard shadow ring as an inexpensive, passive component for thermal protection of substrate carrier that is plasma etched using a conventional shadow ring. On the other hand, the plasma thermal shield may be used together with the above described actively-cooled shadow ring.

Figure 8:
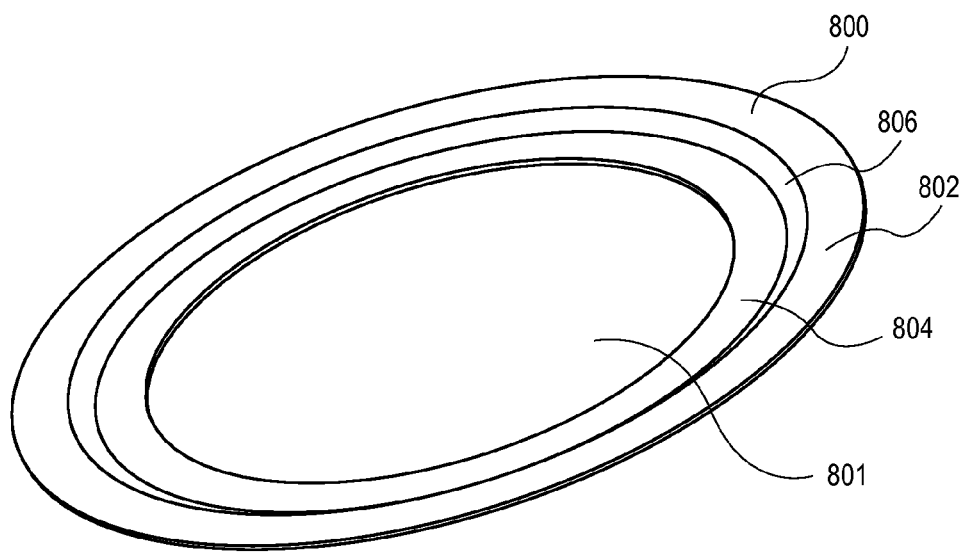
FIG. 8 illustrates an angled top view and angled bottom view of a plasma thermal shield, in accordance with an embodiment of the present invention.
Figure 8:
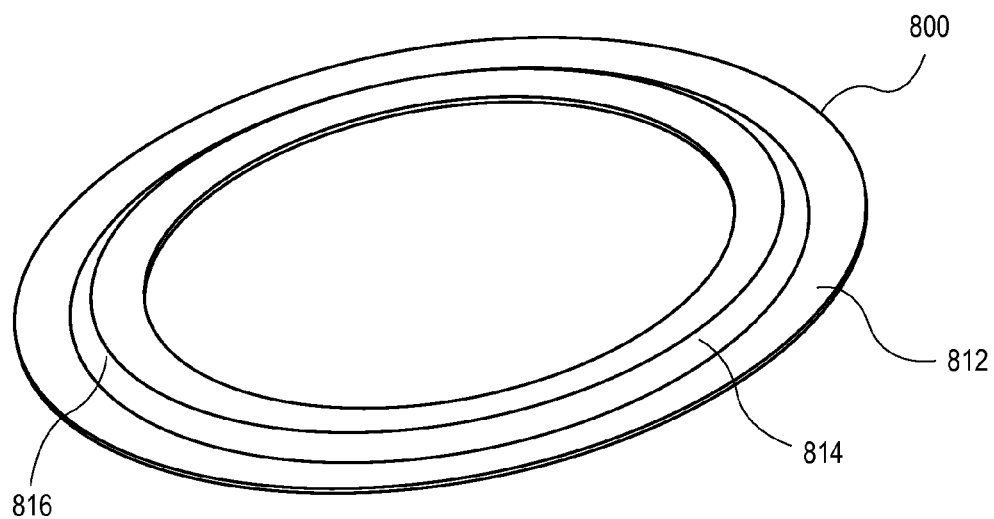

As an example FIG. 8 illustrates an angled top view and angled bottom view of a plasma thermal shield, in accordance with an embodiment of the present invention. Referring to the top view of FIG. 8, a plasma thermal shield 800 is an annular ring with an inner opening 801. In an embodiment, the plasma thermal shield 800 is sized and shaped to be compatible with, e.g., by nesting upon a top surface of, a shadow ring included in a plasma processing chamber. For example, in one such embodiment, the surface of the plasma thermal shield 800 shown in the top view is the surface exposed to a plasma during processing. The surface of the top view includes a first upper surface region 802 which is raised above a second upper surface region 604. The first and second upper surfaces 802 and 804, respectively, are coupled by a sloping region 806.

Referring to the bottom view of FIG. 8, the plasma thermal shield 800 has a bottom surface that is not exposed to a plasma during processing. The surface of the bottom view includes a first lower surface region 812 which is below a second lower surface region 814. The first and second lower surfaces 812 and 814, respectively, are coupled by a sloping region 816. In general, from a high level view, in an embodiment, the bottom surface of the plasma thermal shield 800 reciprocates the general topography of the upper surface. However, some regions of the bottom surface of the plasma thermal shield 800 may be removed for heat dissipating applications.

In an embodiment, the plasma thermal shield 800 is ultimately for nesting on an upper surface of a shadow ring (which, in an embodiment, is an actively-cooled shadow ring as described in association with FIG. 7). In an embodiment, the plasma thermal shield 800 and the shadow ring are installed as two separate components. In an embodiment, the plasma thermal shield 800 blocks heat transfer to the shadow ring which is in contact with a tape frame of a substrate or wafer carrier.

Thus, in an embodiment, a plasma thermal shield is cross-sectionally a shell of ceramic located on top of an existing shadow ring. In one embodiment, the material of the plasma thermal shield is the same material as the shadow ring and covers the entire top surface of the shadow ring. The top surface of the plasma thermal shield may or may not be conformal to the shadow ring below. In one embodiment, the top surface of a plasma thermal shield is a continuous surface and the underside has removed areas of material to reduce conduction to the shadow ring. In an embodiment, the contact points between a plasma thermal shield and shadow ring are related to prohibiting plasma into removed areas as well as installation alignment. It is to be appreciated that the removed area cannot be so great as to create a significant plasma in the removed areas. In the plasma environment, the heat generated by the plasma is transferred to the plasma thermal shield. The plasma thermal shield increase in temperature heats up and radiates the heat to the shadow ring below. However, the shadow ring is heated only by radiated energy from the plasma thermal shield and not by direct plasma contact.

In an embodiment, a plasma thermal shield is a single passive part. The shape and material of the plasma thermal shield can be modified for different process conditions. In an embodiment, the plasma thermal shield can be used to reduce the temperature of a shadow ring by a factor in the range of 100-120 degrees Celsius. The plasma thermal shield may also be used as a differentiated material cover for process chemistry modification, essentially providing a dopant source to the plasma process.

In an embodiment, a plasma thermal shield is used together with an actively-cooled shadow ring. Thus, possible assemblies described herein for protecting a substrate or wafer carrier during plasma processing include an actively-cooled shadow ring, a shadow ring having a plasma thermal shield thereon, or an actively-cooled shadow ring having a plasma thermal shield thereon. In all three scenarios, from a plan view perspective, a protective annular ring with exposing inner region is provided for plasma processing of the carrier.

In an aspect of the present invention, an etch reactor is configured to accommodate etching of a thin wafer or substrate supported by a substrate carrier. For example, FIG. 9 illustrates a cross-sectional view of an etch reactor, in accordance with an embodiment of the present invention.

Figure 9:
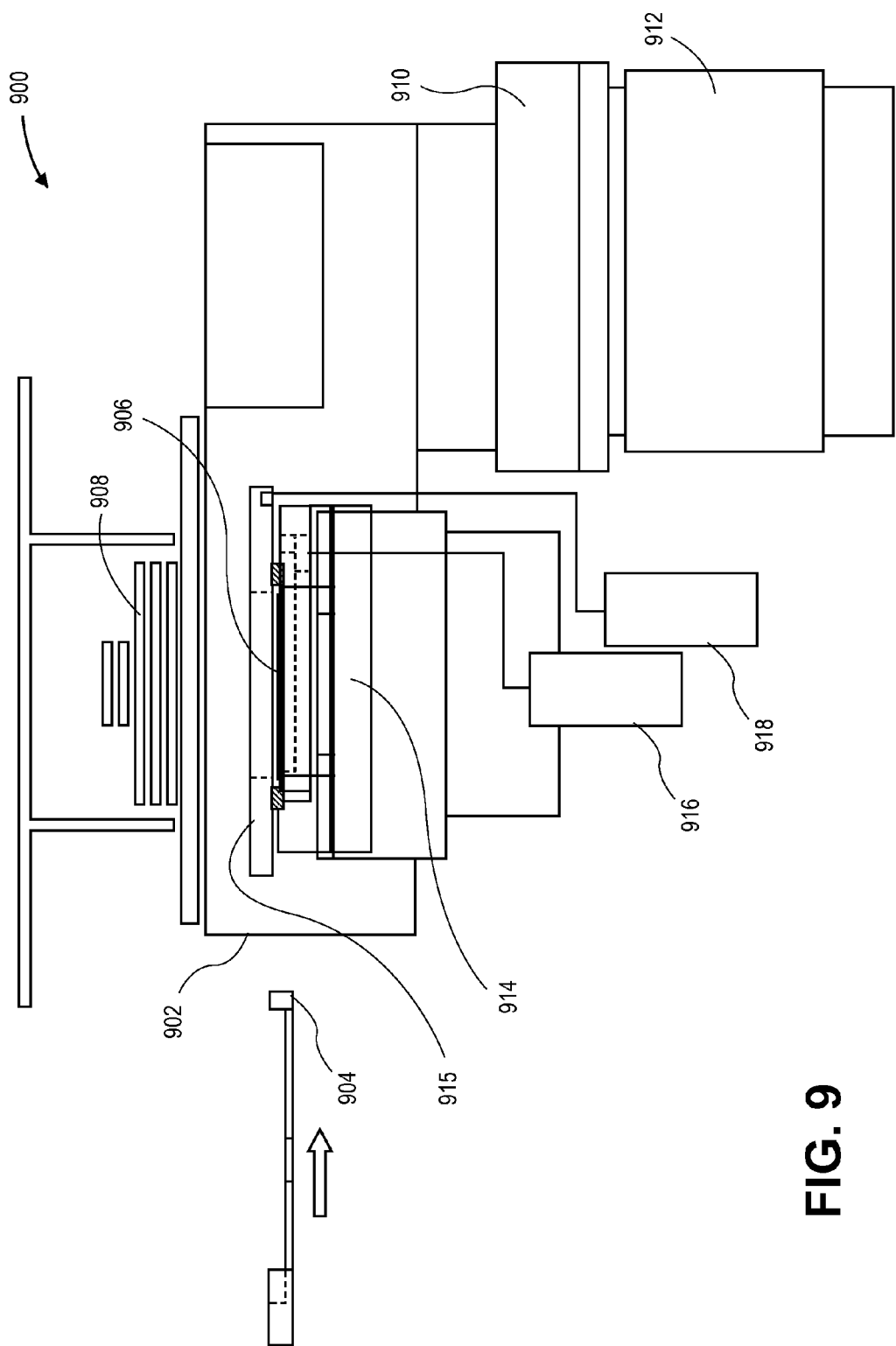
FIG. 9 illustrates a cross-sectional view of an etch reactor, in accordance with an embodiment of the present invention.

Referring to FIG. 9, an etch reactor 900 includes a chamber 902. An end effector 904 is included for transferring a substrate carrier 906 (such as described in association with FIG. 6A) to and from chamber 902. An inductively coupled plasma (ICP) source 908 is positioned in an upper portion of the chamber 902. The chamber 902 is further equipped with a throttle valve 910 and a turbo molecular pump 912. The etch reactor 900 also includes a cathode assembly 914 (e.g., an assembly including an etch cathode or etch electrode). A shadow ring assembly 915 is included above the region accommodating the substrate or wafer carrier 906. In an embodiment, the shadow ring assembly 915 is one of a shadow ring, an actively-cooled shadow ring, a shadow ring having a plasma thermal shield thereon, or an actively-cooled shadow ring having a plasma thermal shield thereon. A shadow ring actuator 918 may be included for moving the shadow ring. Other actuators, such as actuator 916 may also be included.

In an embodiment, the end effector 904 is a robot blade sized for handling a substrate carrier. In one such embodiment, the robotic end effector 904 supports a film frame assembly (e.g., substrate carrier 600 from FIG. 6A) during transfer to and from an etch reactor under sub-atmospheric pressure (vacuum). The end effector 904 includes features to support the substrate carrier in the X-Y-Z axis with gravity-assist. The end effector 904 also includes a feature to calibrate and center the end effector with respect to circular features of a processing tool (e.g., an etch cathode center, or a center of a circular silicon wafer).

In one embodiment, an etch electrode of the cathode assembly 914 is configured to allow RF and thermal coupling with the substrate carrier to enable plasma etching. However, in an embodiment, the etch electrode only contacts a backing tape portion of a substrate carrier and not the frame of the substrate carrier.

In an embodiment, the shadow ring 915 includes a protective annular ring, a lift hoop, and three supporting pins coupled between the lift hoop and the protective annular ring, as described in association with FIG. 7. The lift hoop is disposed in a processing volume radially outwards of a supporting assembly. The lift hoop is mounted on shaft in a substantially horizontal orientation. The shaft is driven by an actuator to move the lift hoop vertically in the processing volume. The three supporting pins extend upward from the lift hoop and position the protective annular ring above the supporting assembly. The three supporting pins may fixedly attach the protective annular ring to the lift hoop. The protective annular ring moves vertically with the lift hoop in the processing volume so that the protective annular ring can be positioned at a desired distance above a substrate and/or an exterior substrate handling device (such as a substrate carrier) can enter the processing volume between the protective annular ring and the supporting assembly to transfer the substrate. The three supporting pins may be positioned to allow the substrate carrier to be transferred in and out of a processing chamber between the supporting pins.

In another aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers and, possibly, cut through the substrate. The laser etch process may then be terminated upon exposure of, or partial scribe of (or, possibly, complete scribe of), the wafer or substrate. The plasma etch portion of the dicing process may then be employed to etch through the bulk of the wafer or substrate, such as through bulk single crystalline silicon, to yield die or chip singulation or dicing. In an embodiment, the wafer or substrate is supported by a substrate carrier and has an overlying protection mask disposed thereon during at least the laser portion of the singulation process and, possibly, both the laser portion and the plasma etch portion of the singulation process.

Figure 10:
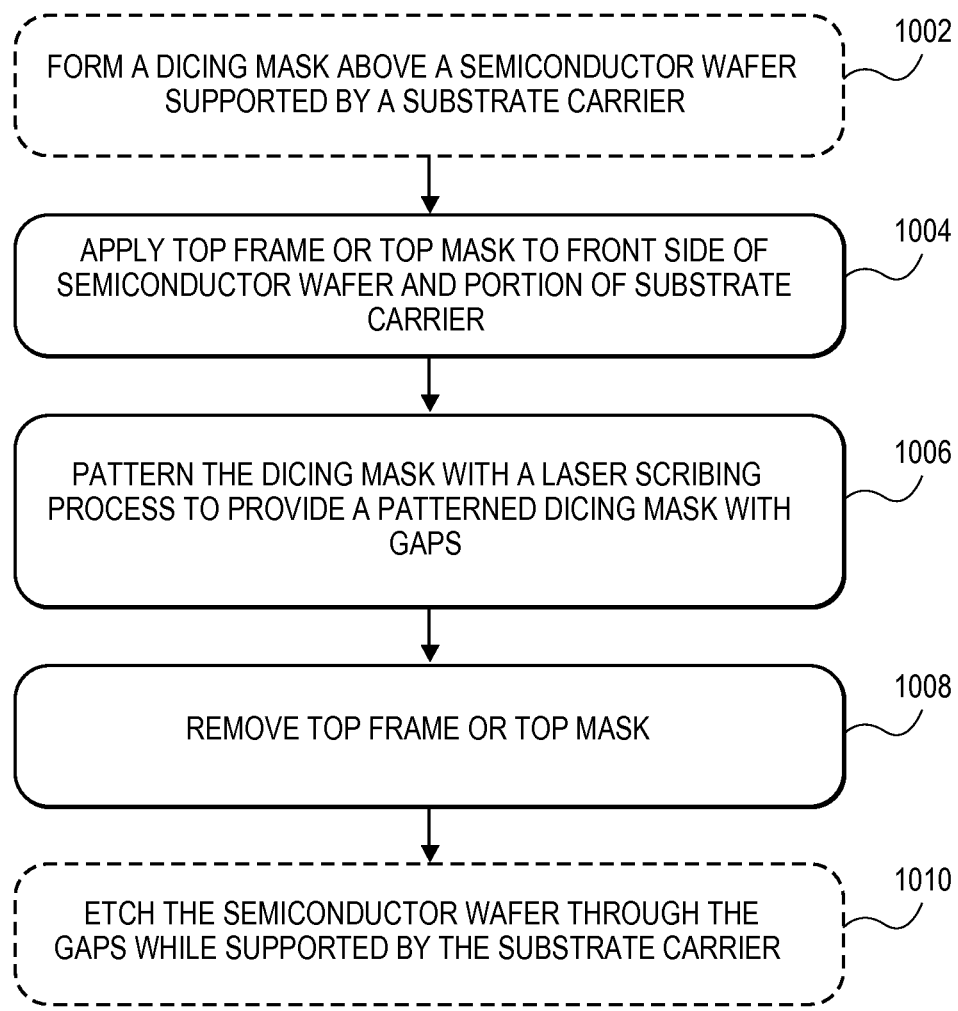
FIG. 10 is a Flowchart representing operations in a method of dicing a semiconductor wafer including a plurality of integrated circuits, in accordance with an embodiment of the present invention.
Figure 11A:
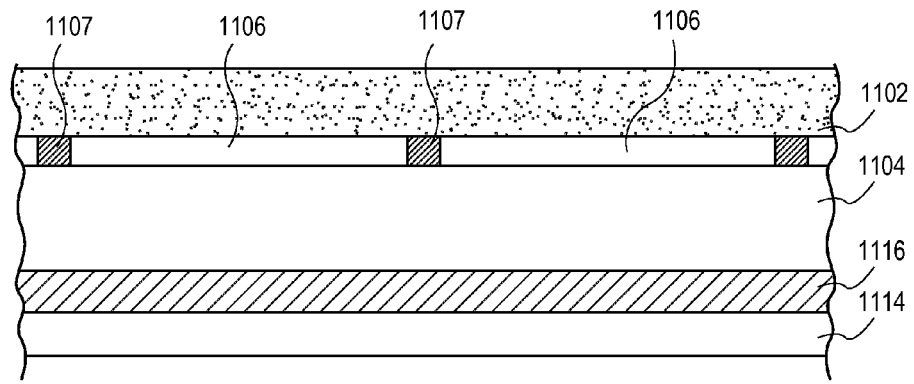
FIG. 11A illustrates a cross-sectional view of a semiconductor wafer including a plurality of integrated circuits during performing of a method of dicing the semiconductor wafer, corresponding to operation 1002 of the Flowchart of FIG. 10, in accordance with an embodiment of the present invention.
Figure 11B:
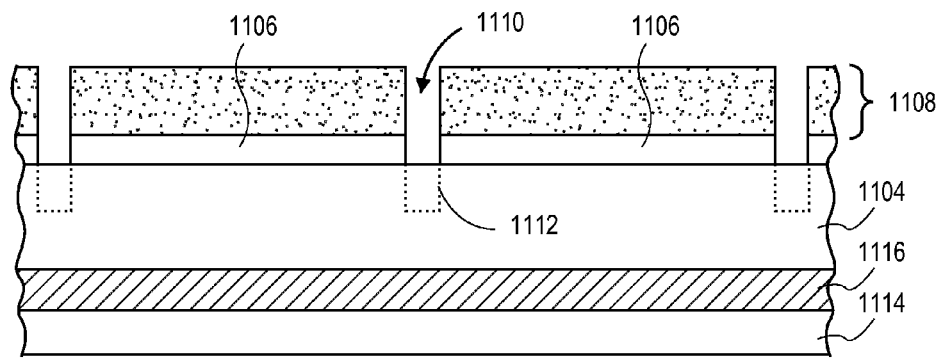
FIG. 11B illustrates a cross-sectional view of a semiconductor wafer including a plurality of integrated circuits during performing of a method of dicing the semiconductor wafer, corresponding to operation 1006 of the Flowchart of FIG. 10, in accordance with an embodiment of the present invention.
Figure 11C:
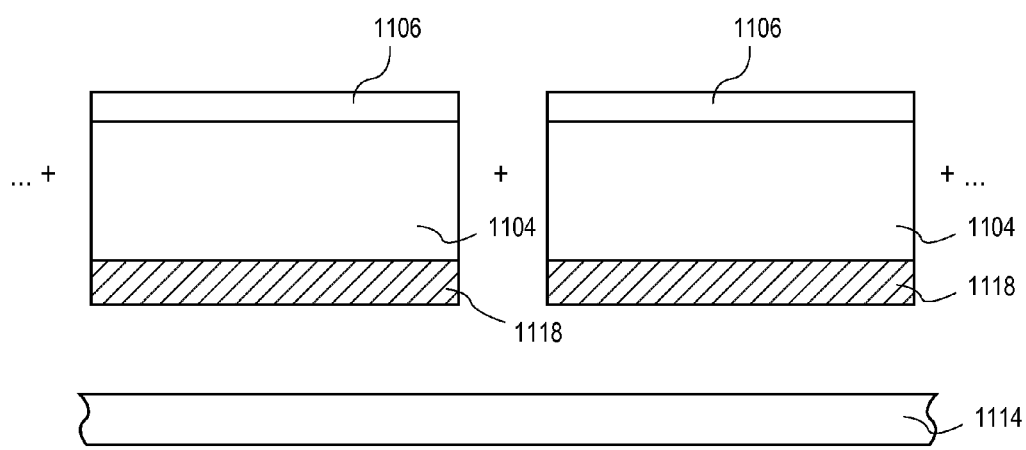
FIG. 11C illustrates a cross-sectional view of a semiconductor wafer including a plurality of integrated circuits during performing of a method of dicing the semiconductor wafer, corresponding to operation 1010 of the Flowchart of FIG. 10, in accordance with an embodiment of the present invention.

As an example, FIG. 10 is a Flowchart 1000 representing operations in a method of dicing a semiconductor wafer including a plurality of integrated circuits, in accordance with an embodiment of the present invention. FIGS. 11A-11C illustrate cross-sectional views of a semiconductor wafer including a plurality of integrated circuits during performing of a method of dicing the semiconductor wafer, corresponding to operations of Flowchart 1000, in accordance with an embodiment of the present invention.

Referring to operation 1002 of Flowchart 1000, and corresponding FIG. 11A, a mask 1102 is optionally formed above a semiconductor wafer or substrate 1104. The mask 1102 is composed of a layer covering and protecting integrated circuits 1106 formed on the surface of semiconductor wafer 1104. The mask 1102 also covers intervening streets 1107 formed between each of the integrated circuits 1106. The semiconductor wafer or substrate 1104 is supported by a substrate carrier 1114.

In an embodiment, the substrate carrier 1114 includes a layer of backing tape, a portion of which is depicted as 1114 in FIG. 11A, surrounded by a tape ring or frame (not shown). In one such embodiment, the semiconductor wafer or substrate 1104 is disposed on a die attach film 1116 disposed on the substrate carrier 1114, as is depicted in FIG. 11A. In an embodiment, referring to operation 1004 of Flowchart 1000 and as described in association with FIGS. 2, 3, 4A-4C and 5, a top dicing tape protection mask or frame (not shown) having an inner diameter slightly less than the diameter of the semiconductor wafer or substrate 1104 is positioned above wafer-on-tape frame assembly 1114/1104. In one such embodiment, a protection mask based on a patterned adhesive tape is used and the mask 1102 is formed prior to adhering the adhesive tape to the front side of the substrate 1104 and, possibly, the adhesive tape overlaps a portion of the mask 1102. In another embodiment, a protection mask based on a patterned adhesive tape is used and the mask 1102 is formed subsequent to adhering the adhesive tape to the front side of the substrate 1104 and, possibly, the mask 1102 overlaps a portion of the adhesive tape. In another embodiment, a protection frame is used and the mask 1102 is formed prior to overlaying the protection frame above the substrate 1104/carrier 1114 assembly.

In accordance with an embodiment of the present invention, forming the mask 1102 includes forming a layer such as, but not limited to, a photo-resist layer or an Mine patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 1102 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 1102 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 1104 is composed of a material suitable to withstand a fabrication process and upon which semiconductor processing layers may suitably be disposed. For example, in one embodiment, semiconductor wafer or substrate 1104 is composed of a group IV-based material such as, but not limited to, crystalline silicon, germanium or silicon/germanium. In a specific embodiment, providing semiconductor wafer 1104 includes providing a monocrystalline silicon substrate. In a particular embodiment, the monocrystalline silicon substrate is doped with impurity atoms. In another embodiment, semiconductor wafer or substrate 1104 is composed of a material such as, e.g., a material substrate used in the fabrication of light emitting diodes (LEDs).

In an embodiment, the semiconductor wafer or substrate 1104 has a thickness of approximately 300 microns or less and, possibly, a thickness of 100 microns or less. For example, in one embodiment, a bulk single-crystalline silicon substrate is thinned from the backside prior to being affixed to the die attach film 1116. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 1116 (or any suitable substitute capable of bonding a thinned or thin wafer or substrate to the substrate carrier 1114) has a thickness of approximately 20 microns.

In an embodiment, the semiconductor wafer or substrate 1104 has disposed thereon or therein, as a portion of the integrated circuits 1106, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 1106. Materials making up the streets 1107 may be similar to or the same as those materials used to form the integrated circuits 1106. For example, streets 1107 may be composed of layers of dielectric materials, semiconductor materials, and metallization. In one embodiment, one or more of the streets 1107 includes test devices similar to the actual devices of the integrated circuits 1106.

Referring to operation 1006 of Flowchart 1000, and corresponding FIG. 11B, the mask 1102 is patterned with a laser scribing process to provide a patterned mask 1108 with gaps 1110, exposing regions of the semiconductor wafer or substrate 1104 between the integrated circuits 1106. In one such embodiment, the laser scribing process is a femtosecond-based laser scribing process. The laser scribing process may be used to remove the material of the streets 1107 originally formed between the integrated circuits 1106. In accordance with an embodiment of the present invention, patterning the mask 1102 with the laser scribing process includes forming trenches 1112 partially into (and, possibly, all the way through) the regions of the semiconductor wafer 1104 between the integrated circuits 1106, as is depicted in FIG. 11B.

In other embodiments, the mask 1102 is patterned as applied, e.g., by screen printing a patterned mask, photolithography, or by applying a pre-patterned dry laminate mask, and the laser scribing is used for scribing the streets 1107 and/or portions of the semiconductor wafer 1104.

In an embodiment, patterning the mask 1102 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 1102, the streets 1107 and, possibly, at least a portion of the semiconductor wafer or substrate 1104.

Figure 12:
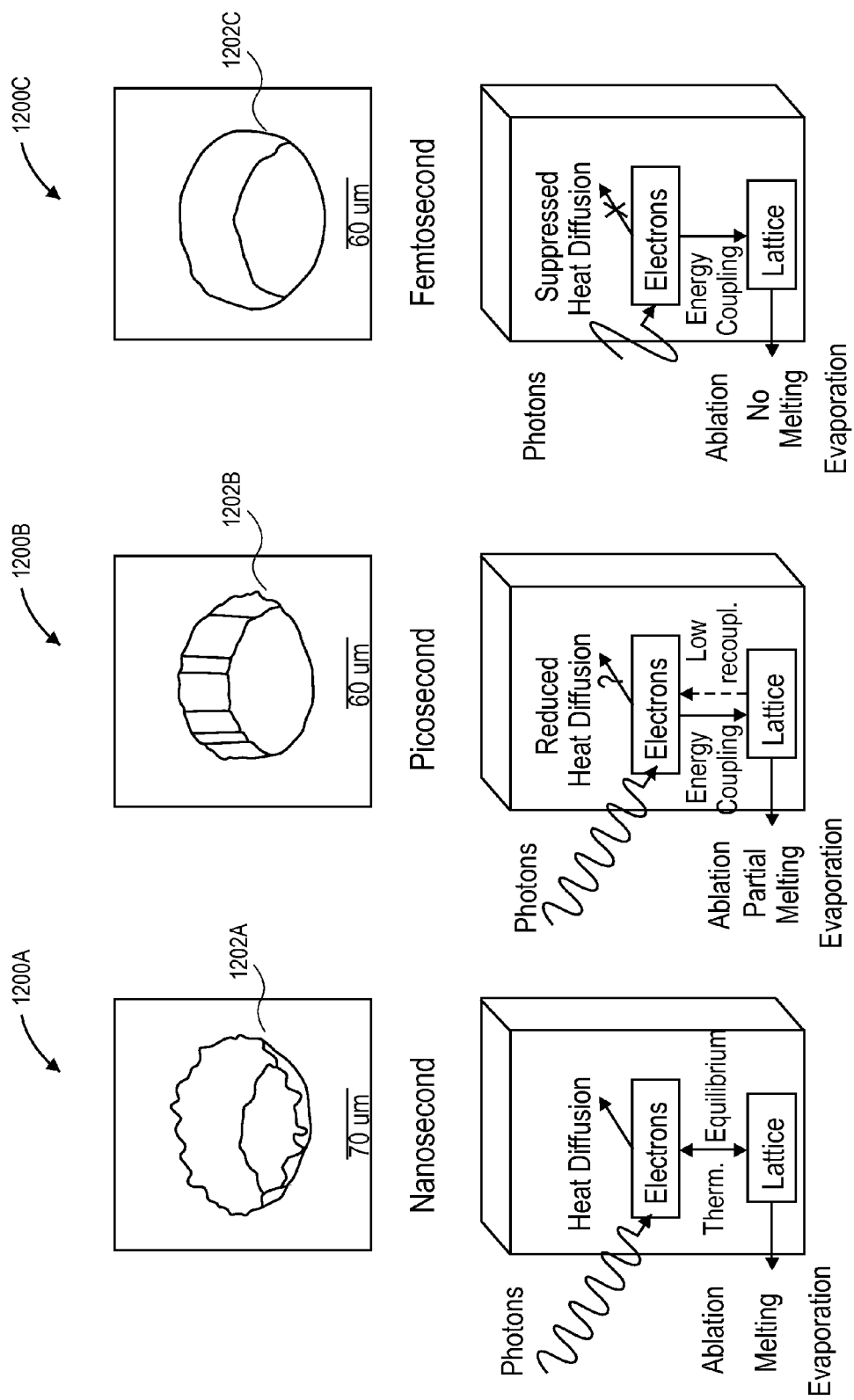
FIG. 12 illustrates the effects of using a laser pulse in the femtosecond range versus longer pulse times, in accordance with an embodiment of the present invention.

FIG. 12 illustrates the effects of using a laser pulse in the femtosecond range versus longer frequencies, in accordance with an embodiment of the present invention. Referring to FIG. 12, by using a laser with a pulse width in the femtosecond range heat damage issues are mitigated or eliminated (e.g., minimal to no damage 1202C with femtosecond processing of a via 1200C) versus longer pulse widths (e.g., damage 1202B with picosecond processing of a via 1200B and significant damage 1202A with nanosecond processing of a via 1200A). The elimination or mitigation of damage during formation of via 1200C may be due to a lack of low energy recoupling (as is seen for picosecond-based laser ablation) or thermal equilibrium (as is seen for nanosecond-based laser ablation), as depicted in FIG. 12.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 1008 of Flowchart 1000, in accordance with an embodiment of the present invention, the top dicing tape protection mask or frame is removed from the wafer-on-tape frame assembly 1114/1104 following laser processing. In the case that the laser scribing is used for singulation, the process essentially ends at this stage. However, in the case that the laser scribing only scribes, but does not singulate the semiconductor wafer 1104, the process may continue with a plasma etch process, as described below. In the case that a protection frame is used at operation 1004, the protection frame is, in one embodiment, removed prior to the plasma etching. In the case that a protection tape is used at operation 1004, the protection tape may be removed subsequent to or prior to the plasma etching.

Referring, then, to optional operation 1010 of Flowchart 1000, and to corresponding FIG. 11C, the semiconductor wafer or substrate 1104 is etched through the gaps 1110 in the patterned mask 1108 to singulate the integrated circuits 1106. In accordance with an embodiment of the present invention, etching the semiconductor wafer 1104 includes etching to extend the trenches 1112 formed with the laser scribing process and to ultimately etch entirely through semiconductor wafer or substrate 1104, as depicted in FIG. 11C.

In an embodiment, etching the semiconductor wafer or substrate 1104 includes using a plasma etching process. In one embodiment, a through-silicon via type etch process is used. For example, in a specific embodiment, the etch rate of the material of semiconductor wafer or substrate 1104 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 1104 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 1116. In one embodiment, die attach film 1116 is patterned by a technique such as, but not limited to, laser ablation, dry (plasma) etching or wet etching. In an embodiment, the die attach film 1116 is patterned in sequence following the laser scribe and plasma etch portions of the singulation process to provide die attach film portions 1118, as depicted in FIG. 11C. In an embodiment, the patterned mask 1108 is removed after the laser scribe and plasma etch portions of the singulation process, as is also depicted in FIG. 11C. The patterned mask 1108 may be removed prior to, during, or following patterning of the die attach film 1116. In an embodiment, the semiconductor wafer or substrate 1104 is etched while supported by the substrate carrier 1114. In an embodiment, the die attach film 1116 is also patterned while disposed on the substrate carrier 1114.

Accordingly, referring again to Flowchart 1000 and FIGS. 11A-11C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In an embodiment, the substrate dicing is performed on a substrate carrier. In one embodiment, a method involves overlaying a protection frame or mask above the front side of the substrate and substrate carrier for protection of underlying otherwise exposed dicing or carrier tape during laser scribing. In one embodiment, in the case that a protection tape is used (e.g., a front side adhesive tape) a shadow ring or a plasma thermal shield, or both, are implemented during the etch portion of the dicing process and, possibly, covers at least a portion of the front side adhesive tape. Additionally, removal of exposed portions of a die attach film may be performed to provide singulated integrated circuits, each having a portion of a die attach film thereon. The individual integrated circuits, including die attach film portions may then be removed from the substrate carrier 1114, as depicted in FIG. 11C. In an embodiment, the singulated integrated circuits are removed from the substrate carrier 1114 for packaging. In one such embodiment, the patterned die attach film 1118 is retained on the backside of each integrated circuit and included in the final packaging. However, in another embodiment, the patterned die attach film 1114 is removed during or subsequent to the singulation process.

Referring again to FIGS. 11A-11C, the plurality of integrated circuits 1106 may be separated by streets 1107 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 13 illustrates compaction on a semiconductor wafer or substrate achieved by using narrower streets versus conventional dicing which may be limited to a minimum width, in accordance with an embodiment of the present invention.

Figure 13:
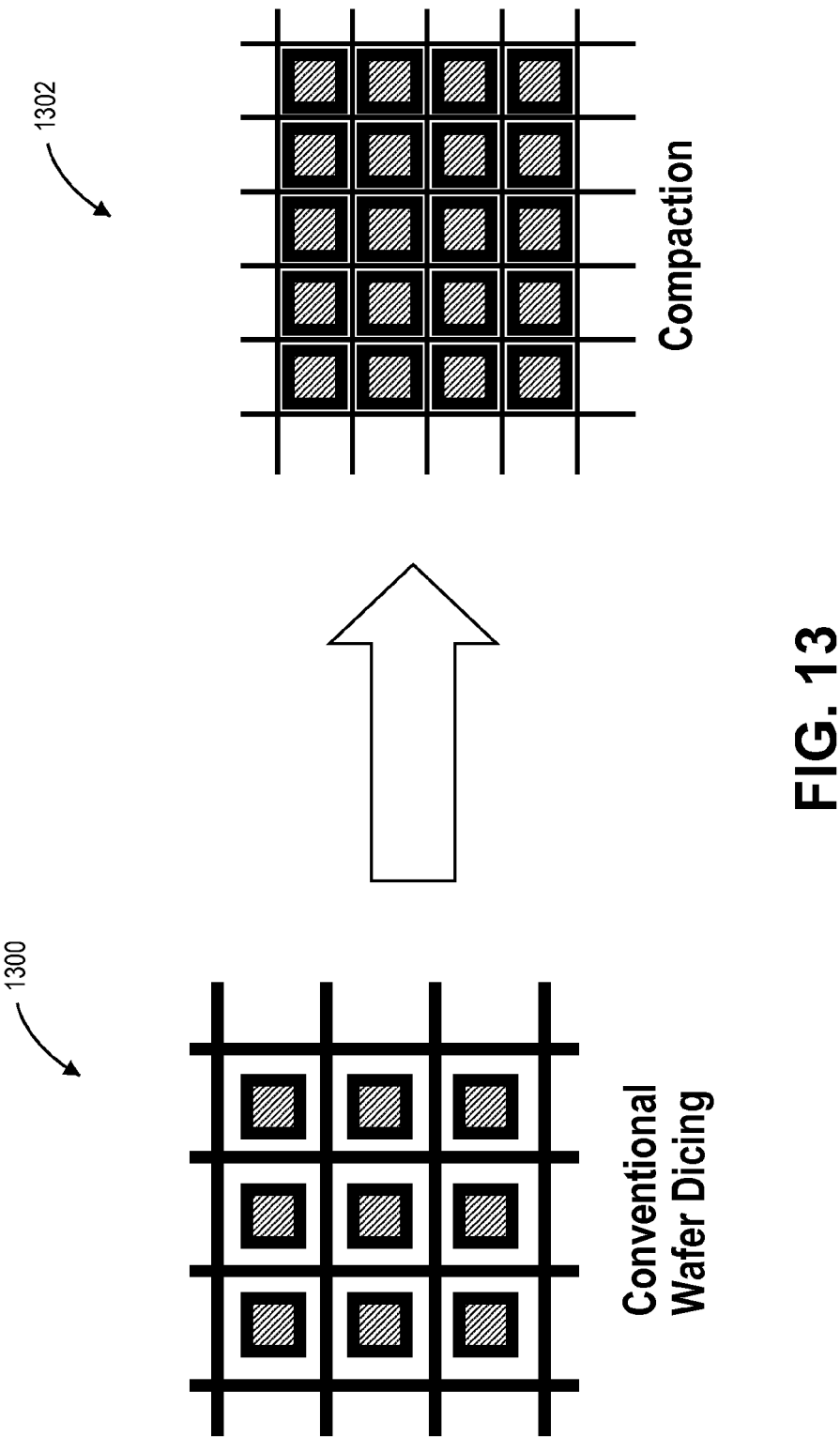
FIG. 13 illustrates compaction on a semiconductor wafer achieved by using narrower streets versus conventional dicing which may be limited to a minimum width, in accordance with an embodiment of the present invention.

Referring to FIG. 13, compaction on a semiconductor wafer is achieved by using narrower streets (e.g., widths of approximately 10 microns or smaller in layout 1302) versus conventional dicing which may be limited to a minimum width (e.g., widths of approximately 70 microns or larger in layout 1300). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 14:
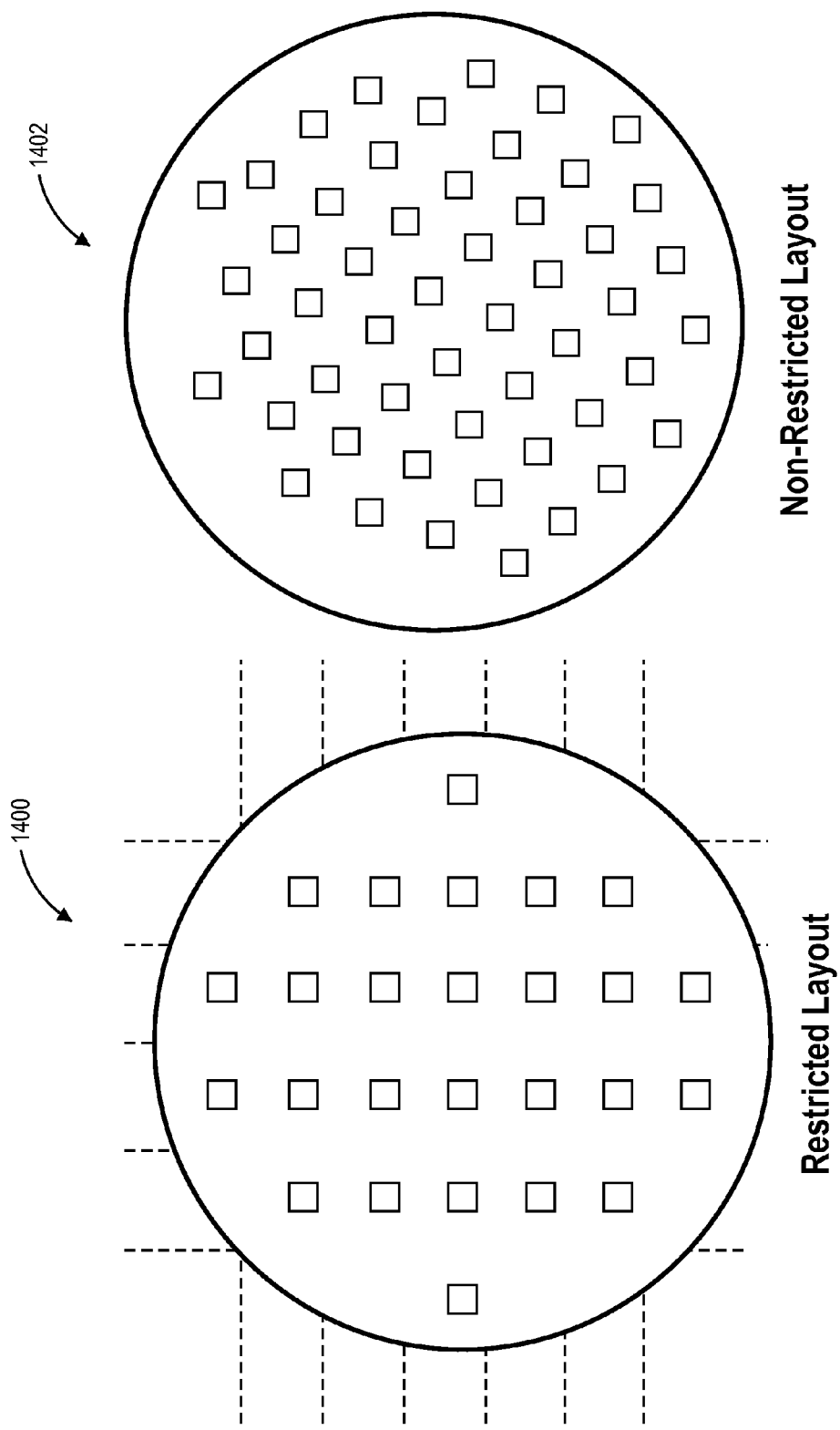
FIG. 14 illustrates freeform integrated circuit arrangement allowing denser packing and, hence, more die per wafer versus grid alignment approaches, in accordance with an embodiment of the present invention.

Referring again to FIGS. 11A-9C, the plurality of integrated circuits 1106 may be arranged on semiconductor wafer or substrate 1104 in a non-restricted layout. For example, FIG. 14 illustrates a freeform integrated circuit arrangement allowing denser packing. The denser packing may provide for more die per wafer versus grid alignment approaches, in accordance with an embodiment of the present invention. Referring to FIG. 14, a freeform layout (e.g., a non-restricted layout on semiconductor wafer or substrate 1402) allows denser packing and hence more die per wafer versus grid alignment approaches (e.g., a restricted layout on semiconductor wafer or substrate 1400). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 15 illustrates a block diagram of a tool layout for laser and plasma dicing of wafers or substrates, in accordance with an embodiment of the present invention.

Figure 15:
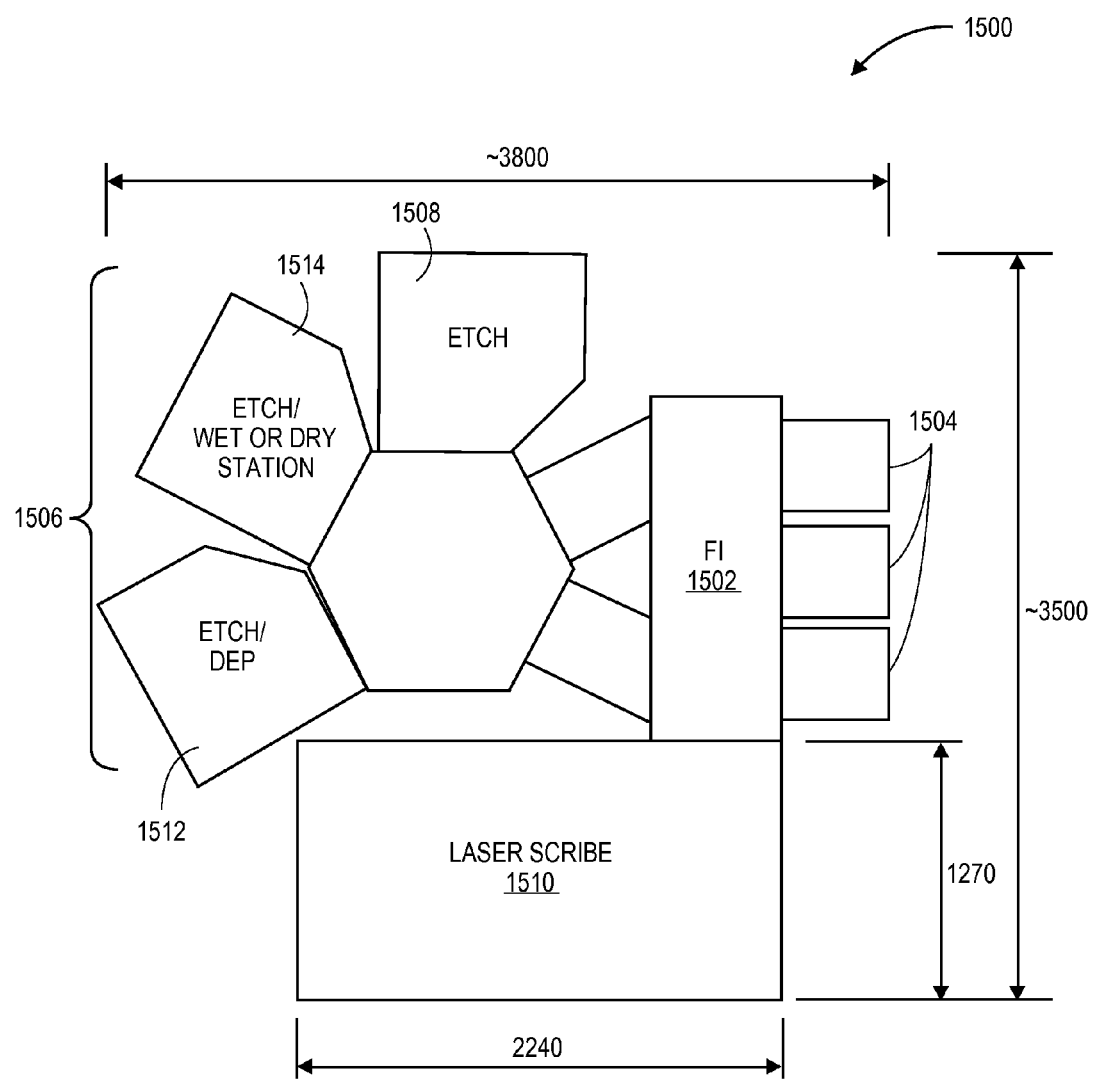
FIG. 15 illustrates a block diagram of a tool layout for laser and plasma dicing of wafers or substrates, in accordance with an embodiment of the present invention.

Referring to FIG. 15, a process tool 1500 includes a factory interface 1502 (FI) having a plurality of load locks 1504 coupled therewith. A cluster tool 1506 is coupled with the factory interface 1502. The cluster tool 1506 includes one or more plasma etch chambers, such as plasma etch chamber 1508. A laser scribe apparatus 1510 is also coupled to the factory interface 1502. The overall footprint of the process tool 1500 may be, in one embodiment, approximately 3500 millimeters (3.5 meters) by approximately 3800 millimeters (3.8 meters), as depicted in FIG. 15.

In an embodiment, the laser scribe apparatus 1510 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 1500, the moveable stage configured for moving a wafer or substrate (or a carrier thereof) relative to the femtosecond-based laser. In a specific embodiment, the femtosecond-based laser is also moveable. The overall footprint of the laser scribe apparatus 1510 may be, in one embodiment, approximately 2240 millimeters by approximately 1270 millimeters, as depicted in FIG. 15. In an embodiment, the scribe apparatus 1510 can accommodate an assembly including a top frame or top mask for dicing tape protection as positioned on top of a wafer-on-tape frame assembly.

In an embodiment, the one or more plasma etch chambers 1508 is configured for etching a wafer or substrate through the gaps in a patterned mask to singulate a plurality of integrated circuits. In one such embodiment, the one or more plasma etch chambers 1508 is configured to perform a deep silicon etch process. In a specific embodiment, the one or more plasma etch chambers 1508 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1508 to facilitate high silicon etch rates. In an embodiment, more than one etch chamber is included in the cluster tool 1506 portion of process tool 1500 to enable high manufacturing throughput of the singulation or dicing process. In accordance with an embodiment of the present invention, one or more of the etch chambers is equipped with a shadow ring or a plasma thermal shield, or both.

The factory interface 1502 may be a suitable atmospheric port to interface between an outside manufacturing facility with laser scribe apparatus 1510 and cluster tool 1506. The factory interface 1502 may include robots with arms or blades for transferring wafers (or carriers thereof) from storage units (such as front opening unified pods) into either cluster tool 1506 or laser scribe apparatus 1510, or both.

Cluster tool 1506 may include other chambers suitable for performing functions in a method of singulation. For example, in one embodiment, in place of an additional etch chamber, a deposition chamber 1512 is included. The deposition chamber 1512 may be configured for mask deposition on or above a device layer of a wafer or substrate prior to laser scribing of the wafer or substrate. In one such embodiment, the deposition chamber 1512 is suitable for depositing a water soluble mask layer. In another embodiment, in place of an additional etch chamber, a wet/dry station 1514 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 1500. In yet another embodiment, in place of an additional etch chamber, a station is included for applying a top patterned adhesive or dicing tape or a top frame to a front side of an apparatus including a substrate or wafer mounted on a substrate carrier. The top patterned adhesive or dicing tape or frame may be implemented to reduce or negate need for perfect laser scribing pulse and motion synchronization for laser scribing passes along the wafer undergoing dicing.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1500 described in association with FIG. 15 or with etch chamber 900 described in association with FIG. 9. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 16:
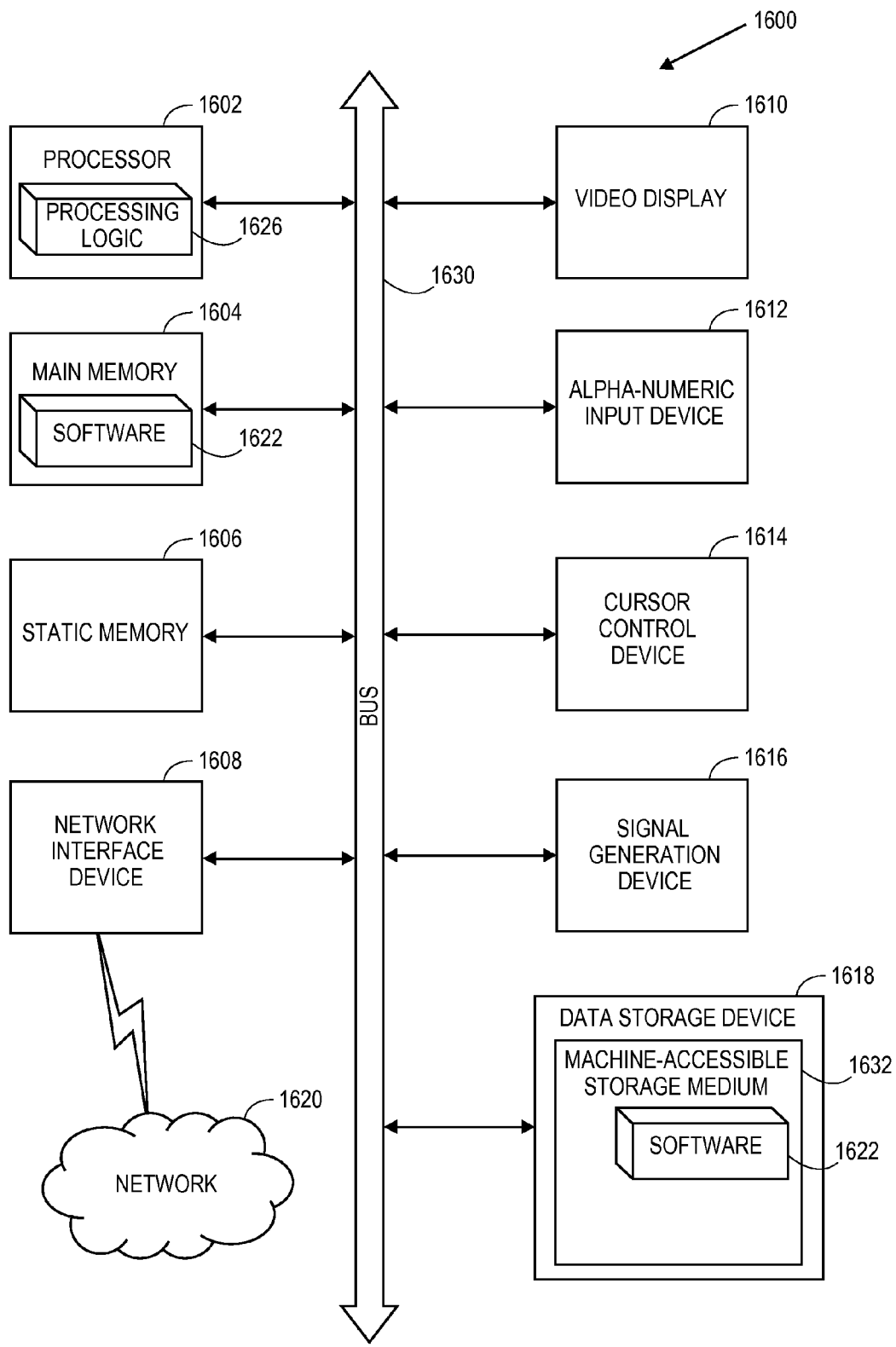
FIG. 16 illustrates a block diagram of an exemplary computer system, in accordance with an embodiment of the present invention.

FIG. 16 illustrates a diagrammatic representation of a machine in the exemplary form of a computer system 1600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1600 includes a processor 1602, a main memory 1604 (e.g., read-only memory (ROM), flash memory, dynamic random access memory (DRAM) such as synchronous DRAM (SDRAM) or Rambus DRAM (RDRAM), etc.), a static memory 1606 (e.g., flash memory, static random access memory (SRAM), etc.), and a secondary memory 1618 (e.g., a data storage device), which communicate with each other via a bus 1630.

Processor 1602 represents one or more general-purpose processing devices such as a microprocessor, central processing unit, or the like. More particularly, the processor 1602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1602 may also be one or more special-purpose processing devices such as an application specific integrated circuit (ASIC), a field programmable gate array (FPGA), a digital signal processor (DSP), network processor, or the like. Processor 1602 is configured to execute the processing logic 1626 for performing the operations described herein.

The computer system 1600 may further include a network interface device 1608. The computer system 1600 also may include a video display unit 1610 (e.g., a liquid crystal display (LCD), a light emitting diode display (LED), or a cathode ray tube (CRT)), an alphanumeric input device 1612 (e.g., a keyboard), a cursor control device 1614 (e.g., a mouse), and a signal generation device 1616 (e.g., a speaker).

The secondary memory 1618 may include a machine-accessible storage medium (or more specifically a computer-readable storage medium) 1632 on which is stored one or more sets of instructions (e.g., software 1622) embodying any one or more of the methodologies or functions described herein. The software 1622 may also reside, completely or at least partially, within the main memory 1604 and/or within the processor 1602 during execution thereof by the computer system 1600, the main memory 1604 and the processor 1602 also constituting machine-readable storage media. The software 1622 may further be transmitted or received over a network 1620 via the network interface device 1608.

While the machine-accessible storage medium 1632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method a method of scribing a semiconductor wafer having a plurality of integrated circuits. The method involves adhering a backside of a semiconductor wafer to an inner portion of a carrier tape of a substrate carrier that includes a tape frame mounted above the carrier tape. The method also involves overlaying a protective frame above a front side of the semiconductor wafer and above an exposed outer portion of the carrier tape, the protective frame having an opening exposing an inner region of the front side of the semiconductor wafer. The method also involves laser scribing the front side of the semiconductor wafer with the protective frame in place.

In accordance with another embodiment of the present invention, a machine-accessible storage medium has instructions stored thereon which cause a data processing system to perform a method a method of scribing a semiconductor wafer having a plurality of integrated circuits. The method involves adhering a backside of a semiconductor wafer to an inner portion of a carrier tape of a substrate carrier that includes a tape frame mounted above the carrier tape. The method also involves adhering a protective mask to a front side of the semiconductor wafer and to an exposed outer portion of the carrier tape, the protective mask having an opening exposing an inner region of the front side of the semiconductor wafer. The method also involves laser scribing the front side of the semiconductor wafer with the protective mask in place.

Thus, methods of and apparatuses for dicing semiconductor wafers, each wafer having a plurality of integrated circuits, have been disclosed.

What is claimed is:

1. A method of scribing a semiconductor wafer comprising a plurality of integrated circuits, the method comprising:
   adhering a backside of a semiconductor wafer to an inner portion of a carrier tape of a substrate carrier comprising a tape frame mounted above the carrier tape;
   overlaying a protective frame above a front side of the semiconductor wafer and above an exposed outer portion of the carrier tape, the protective frame comprising an opening exposing an inner region of the front side of the semiconductor wafer; and
   with the protective frame in place, laser scribing the front side of the semiconductor wafer; and
   subsequent to the laser scribing, removing the protective frame and plasma etching the semiconductor wafer to singulate the integrated circuits.

2. The method of claim 1, wherein the protective frame protects the exposed outer portion of the carrier tape during the laser scribing.

3. The method of claim 2, wherein laser scribing the front side of the semiconductor wafer comprises initiating a scribing pass on a first portion of the protective frame over the exposed outer portion of the carrier tape and terminating the scribing pass on a second portion of the protective frame over the exposed outer portion of the carrier tape.

4. The method of claim 2, wherein the protective frame protects the exposed outer portion of the carrier tape from misfires during the laser scribing process.

5. The method of claim 1, further comprising:
   prior to overlaying the protective frame, applying a dicing mask to the front side of the semiconductor wafer.

6. The method of claim 1, wherein laser scribing the front side of the semiconductor wafer comprises singulating the integrated circuits.

7. The method of claim 1, wherein the opening exposes the inner region comprising at least approximately 98% of the diameter of the front side of the semiconductor wafer.

8. The method of claim 1, wherein the protective frame has a same outermost shape as the tape frame.

9. An apparatus for supporting a semiconductor wafer, the apparatus comprising:
   a substrate carrier comprising a tape frame mounted above a carrier tape;
   a semiconductor wafer processing region, the semiconductor processing region for supporting a semiconductor wafer having a backside mounted to an inner portion of the carrier tape; and
   a protective frame for coupling with the substrate carrier by disposing the protective frame on the tape frame, wherein when the protective frame is coupled to the tape frame of the substrate carrier the protective frame is disposed above the semiconductor wafer processing region and above an exposed outer portion of the carrier tape, the protective frame comprising an opening exposing an inner region of the semiconductor wafer processing region when the protective frame is coupled to the tape frame of the substrate carrier, and wherein the protective frame has a same outermost shape as the tape frame to facilitate alignment to the substrate carrier.

10. The apparatus of claim 9, wherein the opening of the protective frame exposes the inner region comprising at least approximately 98% of the diameter of the front side of the semiconductor wafer processing region when the protective frame is coupled to the tape frame of the substrate carrier.

11. A method of scribing a semiconductor wafer comprising a plurality of integrated circuits, the method comprising:
   adhering a backside of a semiconductor wafer to an inner portion of a carrier tape of a substrate carrier comprising a tape frame mounted above the carrier tape;
   adhering a protective mask to a front side of the semiconductor wafer and to an exposed outer portion of the carrier tape, the protective mask comprising an opening exposing an inner region of the front side of the semiconductor wafer; and
   with the protective mask in place, laser scribing the front side of the semiconductor wafer, wherein the protective mask protects the exposed outer portion of the carrier tape during the laser scribing, and wherein laser scribing the front side of the semiconductor wafer comprises initiating a scribing pass on a first portion of the protective mask over the exposed outer portion of the carrier tape and terminating the scribing pass on a second portion of the protective mask over the exposed outer portion of the carrier tape.

12. The method of claim 11, wherein the protective mask protects the exposed outer portion of the carrier tape from misfires during the laser scribing process.

13. The method of claim 11, further comprising:
   prior to adhering the protective mask, applying a dicing mask to the front side of the semiconductor wafer.

14. The method of claim 11, wherein laser scribing the front side of the semiconductor wafer comprises singulating the integrated circuits.

15. The method of claim 11, further comprising:
   subsequent to the laser scribing, plasma etching the semiconductor wafer to singulate the integrated circuits.

16. The method of claim 11, wherein the opening exposes the inner region comprising at least approximately 98% of the diameter of the front side of the semiconductor wafer.

17. A method of scribing a semiconductor wafer comprising a plurality of integrated circuits, the method comprising:
   adhering a backside of a semiconductor wafer to an inner portion of a carrier tape of a substrate carrier comprising a tape frame mounted above the carrier tape;
   overlaying a protective frame above a front side of the semiconductor wafer and above an exposed outer portion of the carrier tape, the protective frame comprising an opening exposing an inner region of the front side of the semiconductor wafer; and with the protective frame in place, laser scribing the front side of the semiconductor wafer, wherein the protective frame protects the exposed outer portion of the carrier tape during the laser scribing, and wherein laser scribing the front side of the semiconductor wafer comprises initiating a scribing pass on a first portion of the protective frame over the exposed outer portion of the carrier tape and terminating the scribing pass on a second portion of the protective frame over the exposed outer portion of the carrier tape.

18. The method of claim 17, wherein the protective frame protects the exposed outer portion of the carrier tape from misfires during the laser scribing process.

19. The method of claim 17, further comprising:
prior to overlaying the protective frame, applying a dicing mask to the front side of the semiconductor wafer.

20. The method of claim 17, wherein laser scribing the front side of the semiconductor wafer comprises singulating the integrated circuits.

21. The method of claim 17, wherein the opening exposes the inner region comprising at least approximately 98% of the diameter of the front side of the semiconductor wafer.

22. The method of claim 17, wherein the protective frame has a same outermost shape as the tape frame.

23. The apparatus of claim 9, wherein the protective frame is suitable for protecting the exposed outer portion of the carrier tape of the substrate carrier from laser pulse misfires.

* * * * *